(12) United States Patent
Gabel et al.

(10) Patent No.: US 9,640,760 B2
(45) Date of Patent: May 2, 2017

(54) SLOT-DIE COATING METHOD, APPARATUS, AND SUBSTRATE

(71) Applicant: Nederlandse Organisatie voor toegepast—natuurwetenschappelijk onderzoek TNO, 's-Gravenhage (NL)

(72) Inventors: Sabine Juliane Gabel, 's-Gravenhage (NL); Ike Gerke de Vries, 's-Gravenhage (NL)

(73) Assignee: NEDERLANDSE ORGANISATIE VOOR TOEGEPAST—NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

(21) Appl. No.: 14/888,325

(22) PCT Filed: May 2, 2014

(86) PCT No.: PCT/NL2014/050283
§ 371 (c)(1),
(2) Date: Oct. 30, 2015

(87) PCT Pub. No.: WO2014/178716
PCT Pub. Date: Nov. 6, 2014

(65) Prior Publication Data
US 2016/0079533 A1    Mar. 17, 2016

(30) Foreign Application Priority Data

May 3, 2013    (EP) .................................... 13166523

(51) Int. Cl.
*H01L 51/00* (2006.01)
*B05C 5/02* (2006.01)
(Continued)

(52) U.S. Cl.
CPC ........ *H01L 51/0004* (2013.01); *B05C 5/0254* (2013.01); *B05C 5/0258* (2013.01);
(Continued)

(58) Field of Classification Search
None
See application file for complete search history.

(56) References Cited

U.S. PATENT DOCUMENTS 5,536,313 A    7/1996    Watanabe et al.
6,475,282 B1 *  11/2002    Snodgrass ............... B05C 5/004
                                                    118/410
(Continued)

FOREIGN PATENT DOCUMENTS

EP    1 011 298    6/2000
EP    1 316 367    6/2003
(Continued)

OTHER PUBLICATIONS

Gabel et al, Surface energy patterning for continuous coatig processes: A route to high throughput orgainc lighting devices, International Coating Science and Technology Symposium, Sep. 13, 2010.*

(Continued)

*Primary Examiner* — Fernando L Toledo
*Assistant Examiner* — Valerie N Newton
(74) *Attorney, Agent, or Firm* — Pillsbury Winthrop Shaw Pittman, LLP

(57) ABSTRACT

There is disclosed a slot-die coating method and apparatus, and a substrate having a patterned coating layer. The method comprises controlling an intermittent transfer of the coating fluid from a slot-die coating head onto the substrate surface to provide, by said intermittent transfer, coated areas on the substrate surface separated by uncoated areas. The substrate surface comprises a pre-patterned layer of high surface (Continued)

energy areas and low surface energy areas; wherein a contact angle of the coating fluid on the substrate surface is lower in the high surface energy areas than in the low surface energy areas. Boundaries between the low surface energy areas and high surface energy areas are arranged along a slit direction of the slot die coating head. The method further comprises synchronizing the intermittent transfer with a passage of an outflow opening over the boundaries between the low surface energy areas and high surface energy areas wherein the transfer is enabled when the outflow opening passes over a high surface energy area and wherein the transfer is disabled when the outflow opening passes over a low surface energy area.

14 Claims, 12 Drawing Sheets

(51) Int. Cl.
    *B05D 1/26*     (2006.01)
    *B05C 11/10*     (2006.01)
    *H01L 51/42*     (2006.01)
(52) U.S. Cl.
    CPC ............ *B05C 11/1021* (2013.01); *B05D 1/26* (2013.01); *H01L 51/42* (2013.01); *B05D 2252/02* (2013.01)

(56) References Cited

U.S. PATENT DOCUMENTS

| | | | |
|---|---|---|---|
| 6,808,972 | B2 | 10/2004 | Sirringhaus et al. |
| 7,041,336 | B2 | 5/2006 | Masuda et al. |
| 2004/0173148 | A1* | 9/2004 | Kim ...................... B05C 5/0254 118/670 |
| 2006/0062899 | A1 | 3/2006 | Rankin, Jr. et al. |
| 2008/0075837 | A1 | 3/2008 | Bower |
| 2008/0118867 | A1* | 5/2008 | Sato ...................... G03F 7/2057 430/286.1 |
| 2009/0079808 | A1* | 3/2009 | Uemura ................ B41J 2/0057 347/103 |

FOREIGN PATENT DOCUMENTS

| | | |
|---|---|---|
| EP | 1 670 596 | 6/2010 |
| WO | WO 2006/115283 | 11/2006 |

OTHER PUBLICATIONS

International Search Report dated Jul. 28, 2014 for Appln. No. PCT/NL2014/050283.

\* cited by examiner

SLOT-DIE COATING METHOD, APPARATUS, AND SUBSTRATE

FIELD AND BACKGROUND

The present disclosure relates to a slot-die coating method and apparatus for manufacturing a patterned coating layer on a substrate. The disclosure further relates to a substrate manufactured by such a method.

Organic coatings layers are typically applied to a substrate as a liquid solution, e.g. for manufacturing OLED or OPV devices. For many applications, e.g. manufacturing of photo-active layers and/or light-emitting layers, it may be desired to provide one or more homogeneous coating layers on a substrate, i.e. having a homogeneous layer thickness. One technique for manufacturing a homogeneous coating layer may be referred to as "slot-die coating". This technique typically comprises providing a slot-die coating head arranged over a substrate surface. The slot-die coating head comprising an outflow opening forming a slit that is arranged in a slit direction over the substrate surface. A coating fluid, e.g. supplied by a coating fluid supply, flows through the outflow opening onto the substrate surface. A relative movement between the outflow opening and the substrate surface is controlled along a coating direction. The coating direction is typically transverse, i.e. having a perpendicular component, to the slit direction. In this way a homogeneous layer may be manufactured along a width of the slit onto the substrate surface.

In addition to having a homogeneous coating layer, it may be desired to provide a patterning of the coating on the substrate surface, e.g. wherein the patterned coating comprises coated areas on the substrate surface separated by uncoated areas. For example, for the manufacture of photo-active layers and/or light-emitting layers it may be desired to provide separated active areas on a substrate, e.g. for building an array of photo-cells. Many different methods are known for providing a patterned coating layer, e.g. printing or imprinting techniques such as inkjet printing, rotatory screen printing, gravure printing, offset printing, flexo printing. Unfortunately, in practice these processes do not always provide a desired homogeneity of the coating layer and/or suitability for large scale production, e.g. in a roll-to-roll process. It may thus be advantageous to use a patterning technique that can be combined with a slot-die coating process.

A first option for manufacturing a patterned coating with slot-die coating may be referred to as "in-situ patterning" or "active patterning", wherein the slot-die coating head is actively used for selectively applying the coating on specific areas of the substrate. In one example, an intermittent transfer is controlled of the coating fluid from the slot-die coating head onto the substrate surface, e.g. by switching a valve between the slot-die coating head and the coating fluid supply and/or selectively removing the slot-die coating head from the substrate. In this way coated areas may be provided having boundaries transverse to the coating direction. Unfortunately, it is found that an intermittent switching of the supply and/or removal and reapplication of the coating head may result in edge effects wherein the coating is no longer uniform e.g. due to the accumulation of coating material on the coating head.

For example, U.S. Pat. Nos. 7,041,336 and 5,536,313 describe problems with edge effects and propose adaptations to the nozzle to better control the flow-rate out of the nozzle when the flow is interrupted. U.S. Pat. No. 6,475,282 proposes to overcome the problem of leading edge anomalies by monitoring the amount of extrusion material directed to the surface and away from the surface to enable precise control of flow conditions. Disadvantageously, these solutions may lead to a complicated nozzle design. Furthermore adaptation of the flow-rate may not solve specific edge effects, e.g. caused by excess coating fluid sticking to the tip of the coating head and/or caused by lift-off and landing of the coating head on the substrate.

In stead of active patterning, a second option for manufacturing a patterned coating in a slot-die coating process may be referred to as "pre-patterning", wherein a surface energy of the substrate is locally altered by pre-treatment according to a specific pattern. Advantageously, the coating fluid may be applied to the substrate in the same way as for non-patterned slot-die coating, i.e. the slot-die coating head does not require any adaptations, e.g. complicated nozzle designs or a means to displace the coating head. Instead, due to the pre-patterning on the substrate, the coating fluid may automatically dewet areas having relatively low surface energy, e.g. hydrophobic or lyophobic parts, and travel to nearby areas having relatively high surface energy, e.g. hydrophilic or lyophilic parts. In this way a desired pattern may be created by self-assembly. For example, US2008/0075837 describes creating lyophobic or lyophilic surface patterns on a flexible substrate in a roll-to-roll process. Unfortunately, also pre-patterning techniques may suffer from "edge effects" wherein the coating is no longer uniform, e.g. caused by the coating accumulating from the low energy areas to the edges of the high energy areas.

Alternatively still, a third option for manufacturing a patterned coating in a slot-die coating process may be referred to as "post-patterning", wherein a homogeneously applied coating may be selectively removed after deposition. For example, selected parts of the coating layer may be removed by means of wiping, re-dissolving or laser ablation thereby forming a desired pattern. However, wiping and re-dissolving may also suffer from edge effects wherein the coating is no longer uniform. In addition, while laser ablation may be suitable for avoiding some of these effects this technique may not be economically viable for large scale production e.g. due to speed limitations.

There is yet a desire for a comprehensive and economically viable method and apparatus for manufacturing a patterned coating with coated areas having improved homogeneity of the coating layer thickness.

SUMMARY

In a first aspect there is provided a slot-die coating method for manufacturing a patterned coating layer on a substrate, the method comprising providing the substrate comprising a substrate surface; providing a slot-die coating head comprising an outflow opening from which outflow opening, in use, flows a coating fluid, wherein the outflow opening forms a slit that is, in use, arranged in a slit direction over the substrate surface; controlling a relative movement between the outflow opening and the substrate surface along a coating direction transverse to the slit direction; controlling an intermittent transfer of the coating fluid from the slot-die coating head onto the substrate surface to provide, by said intermittent transfer, coated areas on the substrate surface separated by uncoated areas; wherein the substrate surface comprises a pre-patterned layer of high surface energy areas and low surface energy areas; wherein a contact angle of the coating fluid on the substrate surface is lower in the high surface energy areas than in the low surface energy areas; wherein boundaries between the low surface energy areas and high surface energy areas are arranged along the slit direction; and wherein the method further comprises synchronizing the intermittent transfer with a passage of the outflow opening over the boundaries between the low surface energy areas and high surface energy areas wherein the transfer is enabled when the outflow opening passes over a high surface energy area and wherein the transfer is disabled when the outflow opening passes over a low surface energy area.

It will be appreciated that the present disclosure provides an advantageous combination of in-situ patterning using a slot-die coating head and pre-patterning of a substrate surface energy. Surprisingly, it is found that, by this combination, the aforementioned disadvantages of inhomogeneous edges, present in both in-situ patterning and pre-patterning, can be alleviated. Without being bound by theory, this can be understood as follows. On the one hand, because the coating may be applied by the coating head close to the edges of the pre-applied pattern, the coating fluid may retract over a relatively small surface area. This may reduce edge effects of pre-patterning techniques e.g. caused by accumulation of the retracting material. On the other hand, because the intermittently applied coating may be redistributed, driven by the surface energy differences around the edges of the pre-patterned areas, the edges caused by the intermittent application process may be levelled out without flowing beyond the edges. As a result, this combination of techniques may improve homogeneity of the coating layer at the edges and a more homogeneous patterned coating on the substrate is provided. The technique may be applied as a solution based deposition process, e.g. in a roll-to-roll process, making it economically viable for large scale production e.g. compared to printing processes. Further advantages may include an improved edge resolution over in-situ patterning and an improved suitability for large area application compared to pre-patterning.

Furthermore, it was discovered that when the slot-die coating head, while depositing coating fluid in proximity to the substrate, reaches an area having low surface energy, the coating fluid tends to stick to the coating head rather than being deposited on the substrate. The pre-patterning may thus facilitate in cutting off deposition of the coating fluid at the desired edge of the pattern. On the other hand, when the slot-die coating head reaches an area having high surface energy, the coating fluid may tend to stick to the high energy surface of the substrate rather than to the coating head. This may facilitate in resuming application of the coating fluid at the desired edge of the pattern. Accordingly, a timing of the removal and reapplication of the coating head to the substrate becomes less critical.

In a second aspect there is provided a slot-die coating apparatus for manufacturing a patterned coating layer on a substrate, the apparatus comprising a substrate carrier arranged for providing the substrate comprising a substrate surface; a slot-die coating head comprising an outflow opening from which outflow opening, in use, flows a coating fluid, wherein the outflow opening forms a slit that is, in use, arranged in a slit direction over the substrate surface; and a controller arranged for controlling a relative movement between the outflow opening and the substrate surface along a coating direction transverse to the slit direction; wherein the controller is further arranged for controlling an intermittent transfer of the coating fluid from the slot-die coating head onto the substrate surface to provide, by said intermittent transfer, coated areas on the substrate surface separated by uncoated areas; wherein in use, the substrate surface comprises a pre-patterned layer of high surface energy areas and low surface energy areas; wherein a contact angle of the coating fluid on the substrate surface is lower in the high surface energy areas than in the low surface energy areas; wherein boundaries between the low surface energy areas and high surface energy areas are arranged along the slit direction; and wherein the apparatus further comprises a synchronizer arranged for determining the boundaries between the low surface energy areas and high surface energy areas relative to the outflow opening, wherein the synchronizer is operatively linked to the controller for synchronizing the intermittent transfer with a passage of the outflow opening over the boundaries between the low surface energy areas and high surface energy areas wherein the transfer is enabled when the outflow opening passes over a high surface energy area and wherein the transfer is disabled when the outflow opening passes over a low surface energy area.

The slot-die coating apparatus according to the second aspect may provide similar advantages as the method according to the first aspect.

In a third aspect there is provided a substrate comprising a patterned coating layer obtainable by intermittent transfer of a coating fluid from a slot-die coating head to a substrate surface; the slot-die coating head comprising an outflow opening from which outflow opening, in use, flows a coating fluid, wherein the outflow opening forms a slit that is, in use, arranged in a slit direction over the substrate surface; wherein the substrate surface comprises a pre-patterned layer of high surface energy areas and low surface energy areas; wherein a contact angle of the coating fluid on the substrate surface is lower in the high surface energy areas than in the low surface energy areas; wherein boundaries between the low surface energy areas and high surface energy areas are arranged along the slit direction; coated areas of the patterned coating layer cover the high surface energy areas; and uncoated areas of the patterned coating layer are formed at the low surface energy areas separating the coated areas.

The substrate according to the third aspect may be advantageously manufactured using the method according to the first aspect or the slot-die coating apparatus according to the second aspect and provide similar advantages.

BRIEF DESCRIPTION OF THE DRAWINGS

These and other features, aspects, and advantages of the apparatus, systems and methods of the present disclosure will become better understood from the following description, appended claims, and accompanying drawing wherein:

DETAILED DESCRIPTION

Figure 1A:
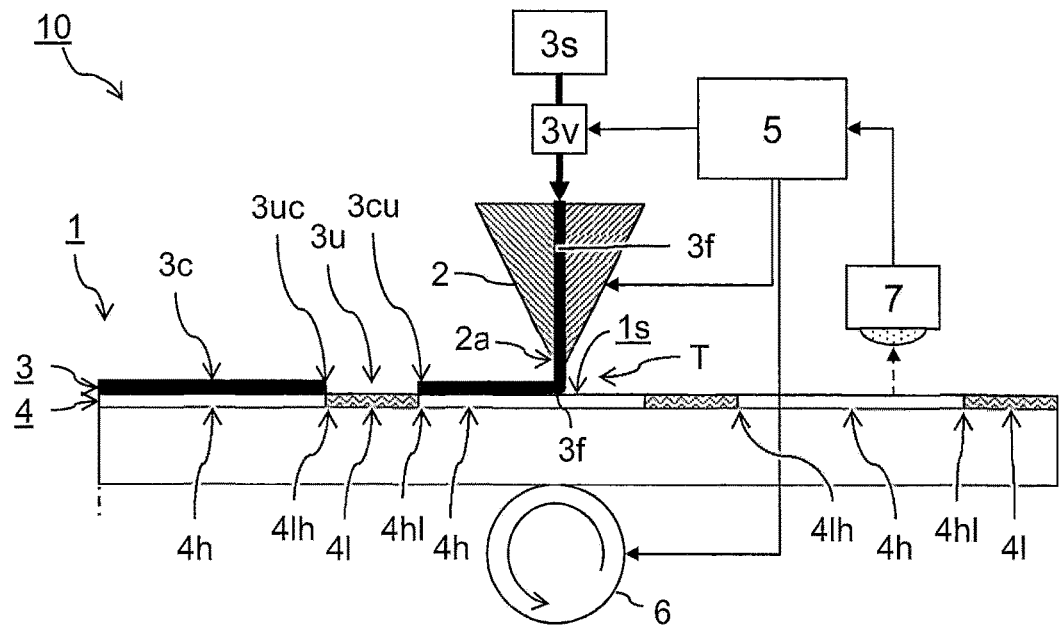
FIGS. 1A and 1B illustrate a slot-die coating method and parts of a slot-die coating apparatus.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

As used herein, the term "substrate" has its usual meaning in materials science as an object comprising a surface on which processing is conducted, in this case layer deposition. In a typical semi-conductor manufacturing process, the substrate may be a silicon wafer. In the production of flexible electronics, the substrate typically comprises a foil. The term "foil" refers to a sheet comprising one or more layers of material. Preferably, the foil is flexible such that it can be used in a roll-to-roll (R2R) or roll to sheet (R2S) manufacturing process. For such purpose, a foil may be considered flexible if it can be rolled or bent over a radius of curvature of 50 cm or less, e.g. 12 cm, without losing its essential functionality, e.g. an electronic functionality. Alternatively, or in conjunction a foil may be considered flexible if it has a flexural rigidity smaller than 500 Pa·m$^{-3}$.

As used herein, a substrate carrier comprises a structure capable of carrying and/or transporting a substrate. For example, in a R2R process, a substrate carrier may comprise one or more rolls arranged for supplying and moving the substrate thereby passing the substrate surface past one or more deposition heads, i.e. in the present case a slot-die coating head. The substrate carrier and/or slot-die coating head are typically comprised in a slot-die coating apparatus, which may comprise further parts, e.g. a coating fluid supply or storage arranged for supplying the coating fluid to the slot-die coating head to provide a continuous or semi-continuous stream of coating fluid from an outflow opening of the coating head.

As used herein, the term "coating" is used to indicate the process of applying a layer of material. The term "coating layer" indicates the layer of material covering a part of a substrate or intermediate layer. Typical for the coating layers as described herein is that they may be initially applied as a fluid or liquid to allow a degree of self-assembly or relocation of the coating after deposition, e.g. driven by differences in surface energy. After the coating layer achieves a desired patterning, the coating layer may be hardened, e.g. by curing and/or drying.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to cross-section illustrations that are schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will further be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout.

Figure 1B:
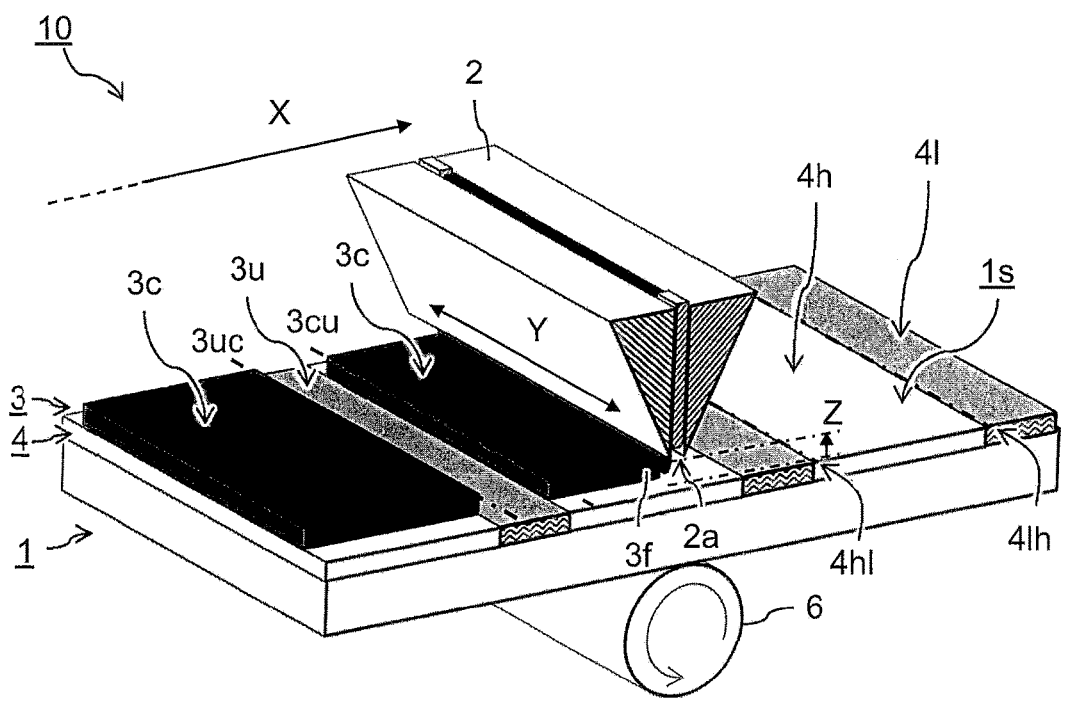

FIGS. 1A and 1B illustrates a slot-die coating method and parts of a slot-die coating apparatus 10 for manufacturing a patterned coating layer 3 on a substrate 1. FIG. 1A provides a schematic cross-sectional view while FIG. 1B provides a perspective view.

A substrate 1 comprising a substrate surface 1s is provided by substrate carrier 6. A slot-die coating head 2 comprising an outflow opening 2a is provided. The outflow opening 2a forms a slit that is arranged in a slit direction Y over the substrate surface 1s. In use, a coating fluid 3f flows from the outflow opening 2a onto the substrate surface 1s. A controller 5 is arranged and/or programmed for controlling a relative movement between the outflow opening 2a and the substrate surface 1s along a coating direction X transverse to the slit direction Y, i.e. the coating direction X has a non-parallel component to the slit direction Y, preferably perpendicular. The controller 5 is further arranged for controlling an intermittent transfer T of the coating fluid 3f from the slot-die coating head 2 onto the substrate surface 1s, i.e. a flow of the coating fluid 3f is interrupted and resumed for specific intervals. The intermittent transfer T provides, coated areas 3c on the substrate surface 1s, separated by uncoated areas 3u.

The substrate surface 1s comprises a pre-patterned layer 4 of high surface energy areas 4h and low surface energy areas 4l. This means that a contact angle of the coating fluid 3f on the substrate surface 1s is lower in the high surface energy areas 4h than in the low surface energy areas 4l. Boundaries 4hl, 4lh between the low surface energy areas 4l and high surface energy areas 4h are arranged along the slit direction Y.

The slot-die coating apparatus 10 comprises a synchronizer 7 arranged for determining the boundaries 4hl, 4lh between the low surface energy areas 4l and high surface energy areas 4h relative to the outflow opening 2a. The synchronizer 7 is operatively linked to the controller 5 for synchronizing the intermittent transfer T with a passage of the outflow opening 2a over the boundaries 4hl, 4lh between the low surface energy areas 4l and high surface energy areas 4h. The transfer is enabled when the outflow opening 2a passes over a high surface energy area 4h and wherein the transfer is disabled when the outflow opening 2a passes over a low surface energy area 4l.

In one embodiment, the synchronizer 7 comprises a sensor element for measuring a surface property of the substrate to be coated. For example, a surface property may comprise a distinct optical characteristic of the substrate, e.g. reflection or transmission spectrum. Also other measurable surface properties of the substrate can be used, e.g. magnetic properties. In one embodiment, the substrate comprises tactile pattern, e.g. an array holes that can be measured by a sensor. The surface property can be used to determine locations on the substrate of the high and low surface energy areas relative to the deposition head. The surface properties of the low and high surface energy areas can be measured directly by the sensor and/or the sensor can be arranged to measure a separate pattern be applied to the substrate and coinciding or otherwise related to the pattern of low and high surface energy areas. In one embodiment, the synchronizer comprises a comparator or comparison circuit for comparing the measured surface properties. The comparison can be relative, e.g. comparing one surface area to another or the comparison can be to a predetermined characteristic, e.g. stored in memory. In one embodiment, the synchronizer comprises a synchronization controller arranged for receiving input from the sensor and/or comparator to determine a passage of substrate. In one embodiment, the synchronizer 7 comprises or communicates with a controller 5 arranged for sending a control signal to the substrate carrier 6 and/or coating valve 3v dependent on the measured properties of the substrate areas.

In one embodiment, the intermittent transfer T of the coating fluid 3f from the slot-die coating head 2 onto the substrate surface 1s is controlled by increasing a distance Z between the outflow opening 2a and the substrate surface 1s to interrupt the transfer; and/or decreasing a distance Z between the outflow opening 2a and the substrate surface 1s to resume the transfer. For example, the apparatus may comprise a motor (not shown) arranged for moving the slot-die coating head 2 and the controller 5 is arranged for controlling the motor. As an example, a transfer of coating fluid may be interrupted by increasing a distance between the outflow opening 2a and substrate surface 1s to about 4 millimeters or higher, dependent on other coating conditions. Transfer may be resumed by decreasing the distance again below this distance. Alternatively or in addition, in an embodiment, the intermittent transfer T of the coating fluid 3f from the slot-die coating head 2 onto the substrate surface 1s is controlled by switching a coating fluid valve 3v between a coating fluid supply 3s and the outflow opening 2a. Alternatively or in addition, a pump arranged for supplying the coating fluid may be switched.

According to one aspect, the resulting substrate 1 comprises a patterned coating layer 3 obtainable by intermittent transfer of a coating fluid 3f from a slot-die coating head 2 to a substrate surface 1s as described above. The substrate surface 1s comprises a pre-patterned layer 4 of high surface energy areas 4h and low surface energy areas 4l. A contact angle of the coating fluid 3f on the substrate surface 1s is lower in the high surface energy areas 4h than in the low surface energy areas 4l. Boundaries 4hl, 4lh between the low surface energy areas 4l and high surface energy areas 4h are arranged along the slit direction Y. Coated areas 3c of the patterned coating layer 3 cover the high surface energy areas 4h. Uncoated areas 3u of the patterned coating layer 3 are formed at the low surface energy areas 4l separating the coated areas 3c.

In general it is understood that while the apparatus 10 is shown as comprising a number of discrete components, e.g. slot-die coating head 2, controller 5 and synchronizer 7, these may all be fully or partially integrated or divided into a different system components. While the coating valve 13v is shown outside the slot-die coating head 2, the valve may also be integrated therein, e.g. close to the outflow opening 2a. Furthermore, while a single controller 5 is shown to control the slot-die coating head 2, substrate carrier 6, and coating valve 3v, the controller may also be partly or fully integrated in the separate system components themselves. The integrated controllers may all or partly be coordinated by a central controller or some controllers may act autonomously. Some system components may not require specific instructions, e.g. the substrate carrier 6 may be arranged to continuously move a substrate without further instructions.

The controller 5 may comprise one or more processors configured to perform operational acts in accordance with the present systems and methods, such as to provide control signals to the slot-die coating head 2, substrate carrier 6, and coating valve 13v. The processor may be a dedicated processor for performing in accordance with the present system or may be a general-purpose processor wherein only one of many functions operates for performing in accordance with the present system. The processor may operate utilizing a program portion, multiple program segments, or may be a hardware device utilizing a dedicated or multi-purpose integrated circuit. Any type of processor may be used such as dedicated or shared one. The processor may include microprocessors, central processing units (CPUs), digital signal processors (DSPs), ASICs, or any other processor(s) or controller(s) such as digital optical devices, or analog electrical circuits that perform the same functions, and employ electronic techniques and architecture. The controller 5 may further comprise a memory that may be part of or operationally coupled to the processor. The memory may be any suitable type of memory where data is stored. Any medium known or developed that can store and/or transmit information suitable for use with the present systems and methods may be used as a memory. The memory may also store user preferences and/or application data accessible by the processor for configuring it to perform operational acts in accordance with the present systems and methods.

The synchronizer 7 may comprise a sensor for determining positions of the high and low surface areas of the pre-patterned coating layer relative to the slot-die coating head 2, optionally in conjunction with the substrate carrier 6. For example, the synchronizer 7 may comprise a camera that records markers on the substrate 1, which markers are indicative of positions of the low surface energy areas 4l and high surface energy areas 4h. Alternatively or in addition, the camera may directly record the low surface energy areas 4l and high surface energy areas 4h, e.g. by a difference in colour or reflectivity. Alternative or in addition to a camera, the synchronizer may also comprise a mechanical sensor in contact with the substrate. For example, the substrate may comprise marker slots, e.g. at a side of the substrate, which slots coincide with a cog wheel of the synchronizer. The cog wheel may rotate synchronized with the marker slots to establish a relative position of the substrate. Such a cog wheel may also be integrated into other components, e.g. substrate carrier 6. It is thus understood that the synchronizer may comprise any means for determining a position of the low surface energy areas 4l and high surface energy areas 4h relative to the outflow opening 2a of the slot-die coating head 2. Using feedback from the synchronizer 7, the controller 5 may adjust the intermittent transfer of the coating fluid 3f to the substrate surface 1s to coincide with a passage of the outflow opening 2a over the boundaries between low surface energy areas 4l and high surface energy areas 4h. Alternatively or in addition to the synchronizer 7, a memory may store predetermined positions of the high and low surface areas of the pre-patterned coating layer.

Figure 2A:
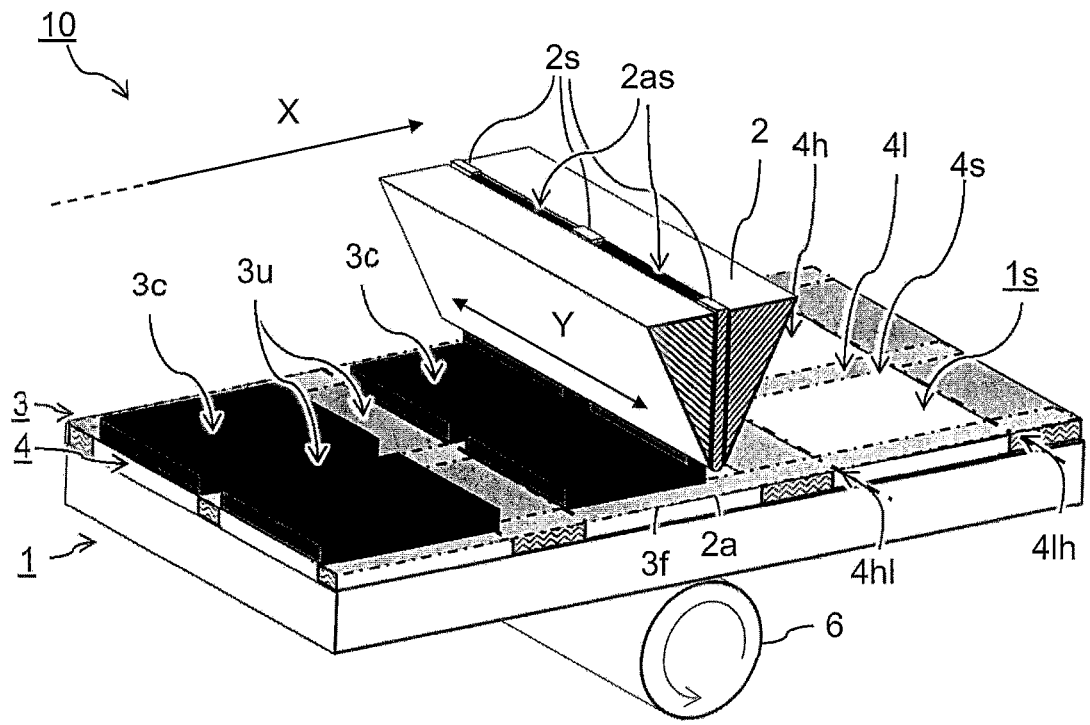
FIGS. 2A and 2B illustrate an embodiment for providing patterning in two directions.
Figure 2B:
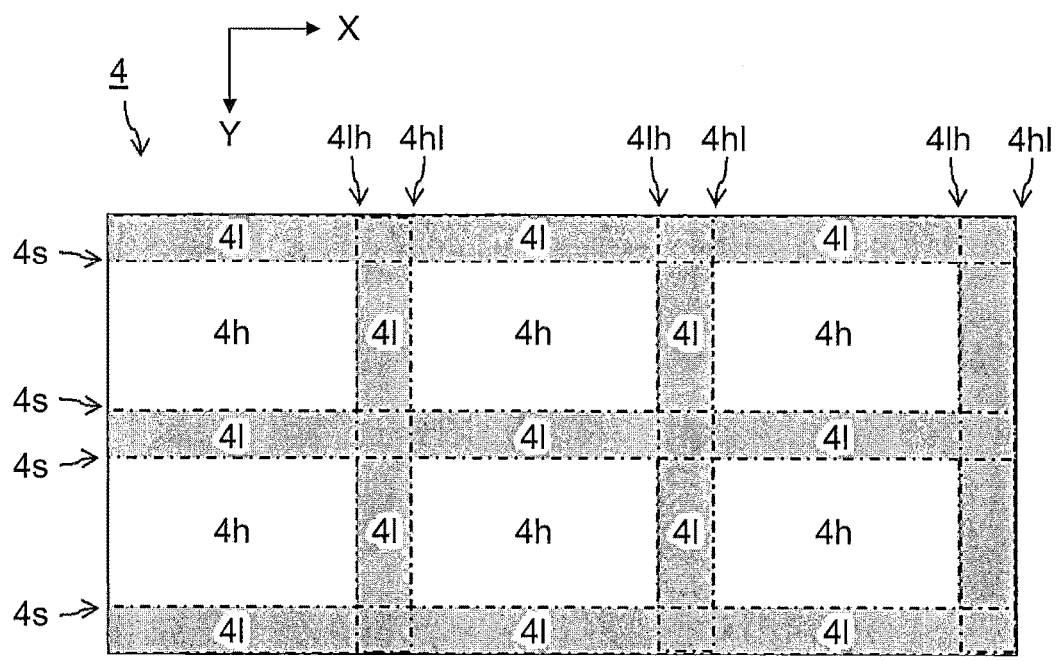

FIGS. 2A and 2B illustrate an embodiment for providing patterning in two directions X and Y. FIG. 2A shows a perspective view of the apparatus 10 and substrate 1 of this embodiment and FIG. 2B shows a top view of the pre-patterned layer 4 of the substrate 1. Using this embodiment, e.g. rectangular coated areas 3c may be formed separated in the X and Y directions by uncoated areas 3u.

As shown, the pre-patterned layer 4 comprises low surface energy areas 4l having parallel boundaries 4s with high surface energy areas 4h along the coating direction X in addition to the low surface energy areas 4l having boundaries 4hl, 4lh in the slit direction Y. One or more shims 2s, i.e. blockades, are arranged at specific positions in the outflow opening 2a. The shims 2s divide the outflow opening 2a into a plurality of slits 2as. In use, the one or more shims 2s are aligned with the boundaries 4s to block a transfer of the coating fluid 3f from the slot-die coating head 2 onto the substrate surface 1s at the said low surface energy areas 4l having parallel boundaries 4s with high surface energy areas 4h along the coating direction X. Advantageously, using the pre-patterned layer 4, a better control may be achieved also for edges along the coating direction X. For example, a homogeneity and/or placement accuracy of the patterned coating layer 3 may be improved.

FIGS. 3-6 illustrate embodiment for synchronizing the intermittent transfer T with the passage of a boundary 4hl or 4lh between high surface energy areas 4h and low surface energy areas 4l. In particular time sequences are shown for switching back and forth a state wherein the transfer between the slot-die coating head 2 and the substrate surface 1s is disabled (T=0) and a state wherein the transfer is enabled (T=1).

In these embodiments, the synchronizing the intermittent transfer T comprises setting a first offset Xhl and/or second offset Xlh measured along the coating direction X. The first offset Xhl indicates a distance between a position of the outflow opening 2a over the substrate surface 1s where the transfer is interrupted (T=1→0) and a boundary 4hl from a high surface energy area 4h to a low surface energy area 4l. The second offset Xlh indicates a distance between a position of the outflow opening 2a over the substrate surface 1s where the transfer is resumed (T=0→1) and a boundary 4lh from a low surface energy area 4l to a high surface energy area 4h. The first offset Xhl and/or second offset Xlh may be positive or negative, i.e. before or after the respective boundaries 4hl and 4lh.

It will be understood that the offsets Xhl and Xlh may be defined as a specific distance or time from the respective boundaries 4hl, 4lh that a signal is provided by the controller to interrupt or resume transfer of the coating fluid, e.g. open/close a valve or increase/decrease a distance between the coating head and the substrate surface.

In one embodiment, as shown in FIG. 3, the transfer is set to be interrupted (T=1→0) just after the outflow opening 2a passes a boundary 4hl from a high surface energy area 4h to a low surface energy area 4l. In another embodiment, as shown in FIGS. 5, the transfer is set to be interrupted (T=1→0) just before the outflow opening 2a passes a boundary 4hl from a high surface energy area 4h to a low surface energy area 4l. In one embodiment, as shown in FIG. 4, the transfer is set to be resumed (T=0→4) just after the outflow opening 2a passes a boundary 4lh from a low surface energy area 4l to a high surface energy area 4h. In another embodiment, as shown in FIGS. 6, the transfer is set to be resumed (T=0→4) just before the outflow opening 2a passes a boundary 4lh from a low surface energy area 4l to a high surface energy area 4h.

Figure 3A:
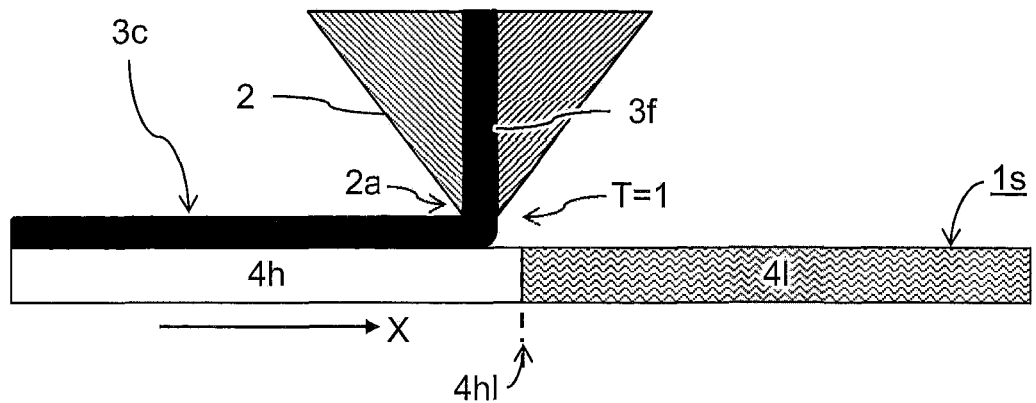
FIGS. 3A-3C illustrates an embodiment of a slot-die coating head moving over a substrate surface.
Figure 3B:
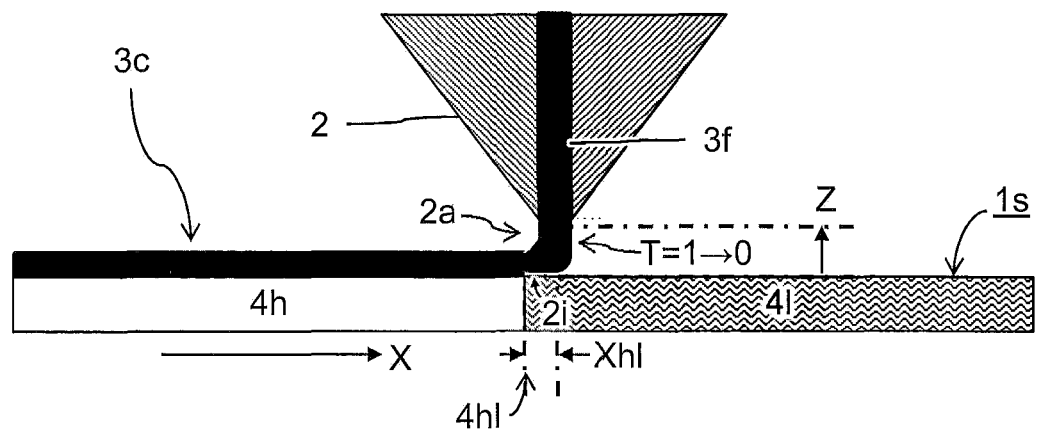
Figure 3C:
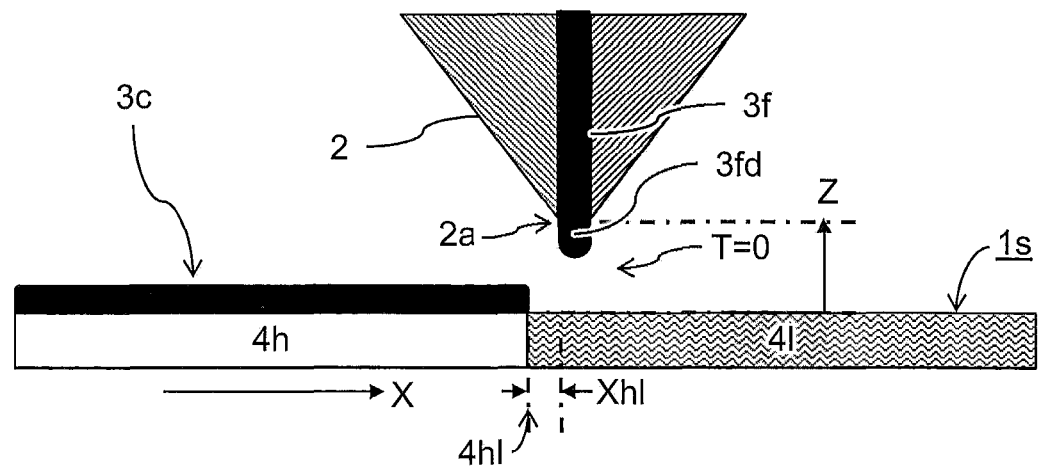

FIGS. 3A-3C illustrate an embodiment wherein a slot-die coating head 2 moves in coating direction X over a boundary 4lh from a low surface energy area 4l to a high surface energy area 4h. In this embodiment, the coating fluid 3f has a tendency to stick to the slot-die coating head 2 rather than to the substrate surface 1s. This may be caused e.g. by coating parameters such as flow rate, nozzle size of the coating head, distance between the coating head and substrate, relative speed between the coating head and substrate, layer thickness, coating fluid properties such as viscosity, degree of surface energy difference of the coating fluid on the substrate but also on the coating head. Typical values for such coating parameters be: distance between the coating head and substrate 25-500 µm; viscosity of the coating fluid 1-100 mPa s; nozzle cross-section diameter 25-250 µm; relative speed between the coating head and substrate 3-30 meters per minute; wet coating layer thickness 5-30 µm. Coating parameters may be determined e.g. experimentally and/or by model calculations.

Initially, as shown in FIG. 3A, transfer is enabled (T=1) between the slot-die coating head 2 and the substrate surface 1s while the slot-die coating head 2 approaches the boundary 4hl. This results in a coated area 3c on top of the high surface energy area 4h.

Then, as shown in FIG. 3B, the transfer is interrupted (T=1→0) at the point that the outflow opening 2a reaches the offset Xhl past boundary 4hl. In this embodiment, transfer is interrupted by increasing a distance Z between the slot-die coating head 2 and the substrate surface 1s. Advantageously, because the coating fluid 3f has a low adhesion to the low surface energy areas 4l and a high adhesion to the high surface energy areas 4h, it is found that the trace of coating fluid 3f dragging behind the slot-die coating head 2 has a higher chance to initiate break-up (indicated by arrow 2i) exactly at the border 4hl between these areas 4h and 4l. In any case, even if break-up occurs before or after the border 4hl, a driving force of a difference in surface energy between the areas 4h and 4l may stimulate the coated areas 3c to extend or retract until the border 4hl.

Finally, as shown in FIG. 3C, transfer is disabled (T=0) while the slot-die coating head 2 moves over the low surface energy area 4l. Due to cohesion forces in the coating fluid 3f and/or adhesion forces with the slot-die coating head 2, a drop of excess coating fluid 3*fd* may be formed at the tip of the slot-die coating head 2 near the outflow opening 2*a*.

Figure 4A:
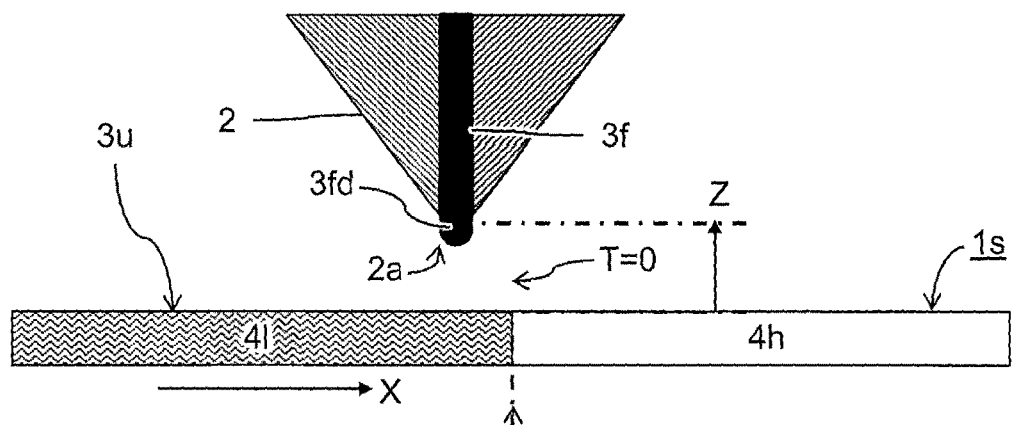
FIGS. 4A-4C illustrates another embodiment of a slot-die coating head moving over a substrate surface.
Figure 4B:
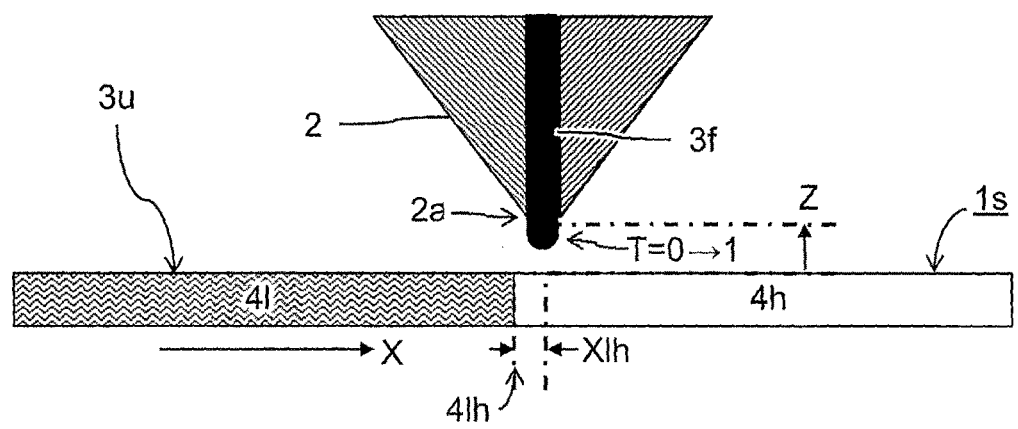
Figure 4C:
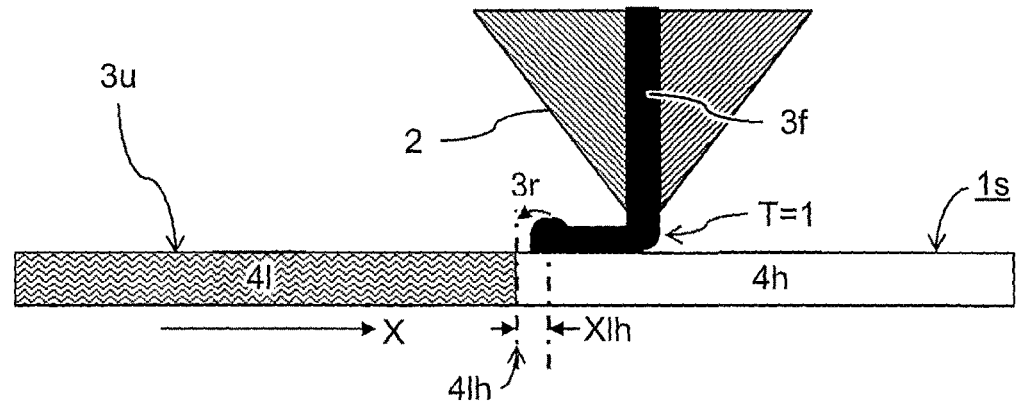

FIGS. 4A-4C illustrate an embodiment wherein a slot-die coating head 2 moves in coating direction X over a boundary 4*lh* from a low surface energy area 4*l* to a high surface energy area 4*h*.

Initially, as shown in FIG. 4A, transfer is disabled (T=0) between the slot-die coating head 2 and the substrate surface 1*s* while the slot-die coating head 2 approaches the boundary 4*lh*. This results in an uncoated area 3*u* on top of the low surface energy area 4*l*. The drop of excess coating fluid 3*fd*, that was formed e.g. in the sequence described in FIGS. 3A-3C hangs from the slot-die coating head 2 near the outflow opening 2*a*.

Then, as shown in FIG. 4B, the transfer is resumed (T=0→1) at the point that the outflow opening 2*a* reaches the offset Xlh past boundary 4*lh*. In this embodiment, transfer is resumed by decreasing a distance Z between the slot-die coating head 2 and the substrate surface 1*s*.

Finally, as shown in FIG. 4C, transfer is enabled (T=1) while the slot-die coating head 2 moves over the high surface energy area 4*h*. As shown the drop of excess coating fluid 3*fd* may result in an initial inhomogeneity at an edge of the coating layer at the offset Xlh where the slot-die coating head 2 has first contacted the substrate surface 1*s*. Advantageously, this inhomogeneity tends to be alleviated by a subsequent rearrangement of the coating fluid 3*f* towards the boundary 4*lh* as indicated by arrow 3*r*.

Figure 5A:
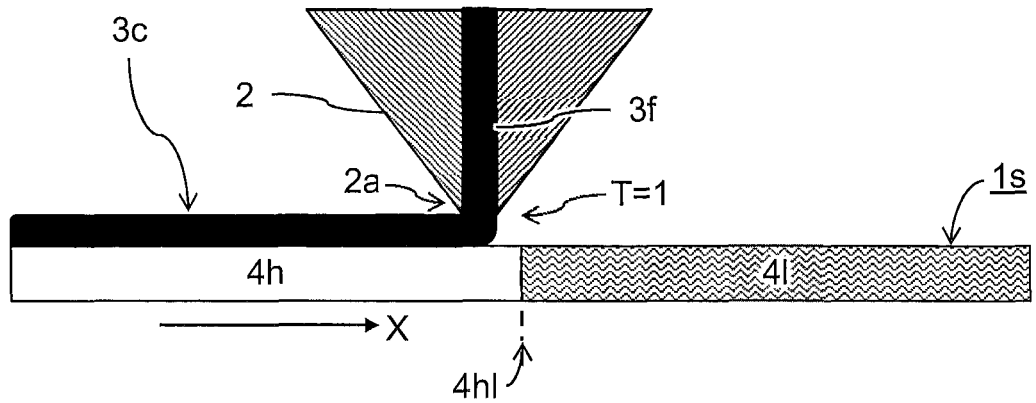
FIGS. 5A-5C illustrates another embodiment of a slot-die coating head moving over a substrate surface.
Figure 5B:
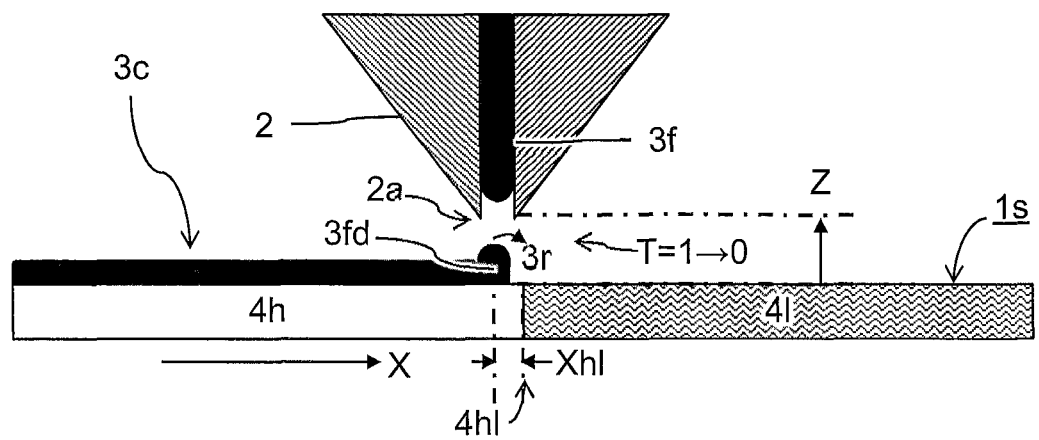
Figure 5C:
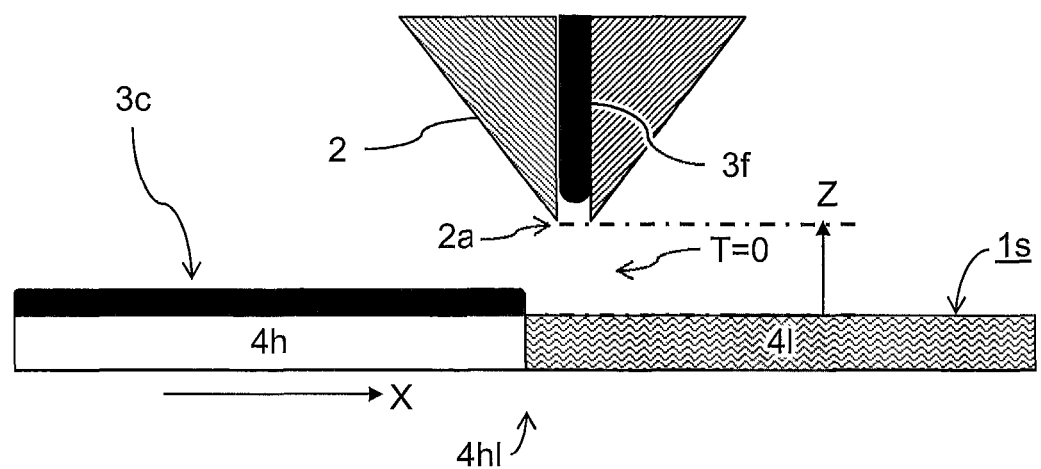

FIGS. 5A-5C illustrate an embodiment wherein a slot-die coating head 2 moves in coating direction X over a boundary 4*lh* from a low surface energy area 4*l* to a high surface energy area 4*h*. As opposed to the embodiment shown in FIGS. 3A-3V, in the present embodiment, the coating fluid 3*f* has a tendency to stick to the substrate surface 1*s* rather than to the slot-die coating head 2.

Initially, as shown in FIG. 5A, transfer is enabled (T=1) between the slot-die coating head 2 and the substrate surface 1*s* while the slot-die coating head 2 approaches the boundary 4*hl*. This results in a coated area 3*c* on top of the high surface energy area 4*h*.

Then, as shown in FIG. 5B, the transfer is interrupted (T=1→0) at the point that the outflow opening 2*a* reaches the offset Xhl past boundary 4*hl*. In this embodiment, transfer is interrupted by increasing a distance Z between the slot-die coating head 2 and the substrate surface 1*s*. In this embodiment, because the coating fluid 3*f* has a high affinity to stick to the high surface energy area 4*h* and less to the slot-die coating head 2, a drop of excess coating fluid 3*fd* is formed on the substrate surface 1*s* upon removal of the slot-die coating head 2. Because the transfer was interrupted (T=1→0) with an offset Xhl from the boundary 4*hl*, the drop of excess coating fluid 3*fd* can still expand to fill the remaining area of the high surface energy area 4*h* until it reaches the low surface energy area 4*l*. This is indicated by arrow 3*r*.

Finally, as shown in FIG. 5C, transfer is disabled (T=0) while the slot-die coating head 2 moves over the low surface energy area 4*l*. As shown, the drop of excess coating fluid 3*fd* has now expanded to fill the remaining area of the high surface energy area 4*h* and a homogeneity of the edge thickness is improved. It will be appreciated that by adjusting the offset Xhl to a size of the drop of excess coating fluid 3*fd*, e.g. by experimentation or modelling with a given set of coating parameters, a layer thickness variation of the resulting coated areas 3*c* can be minimized.

Figure 6A:
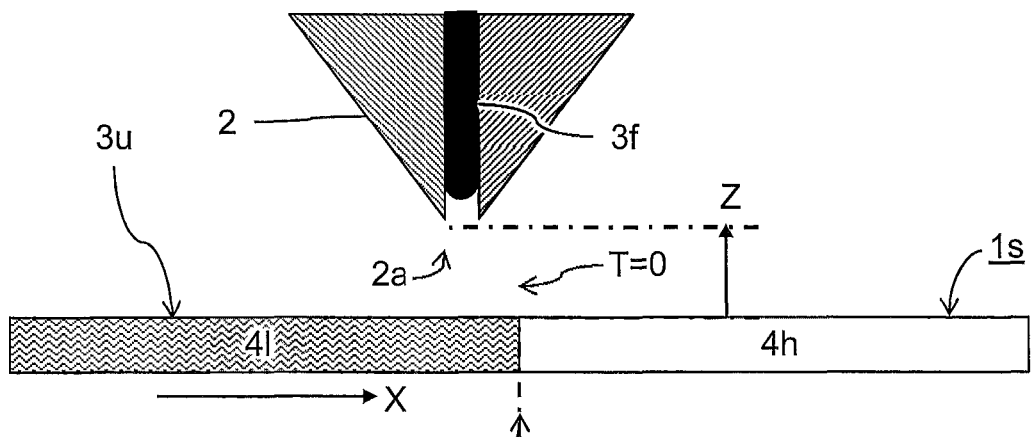
FIGS. 6A-6C illustrates another embodiment of a slot-die coating head moving over a substrate surface.
Figure 6B:
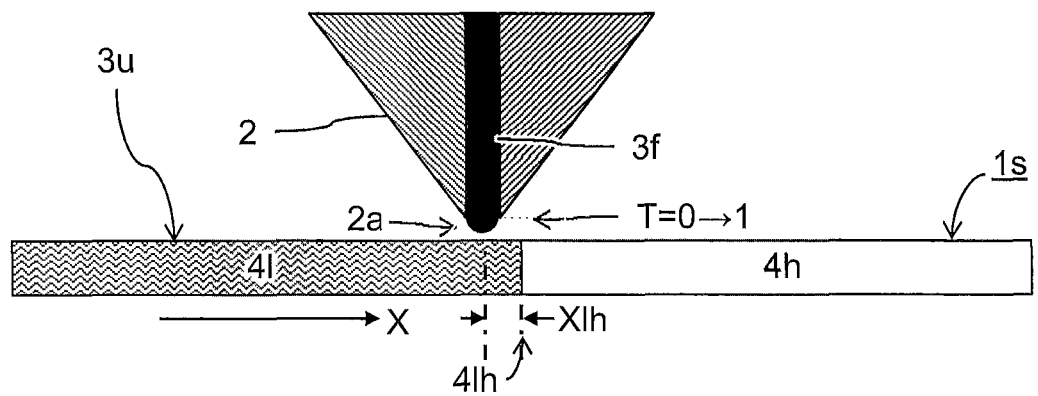
Figure 6C:
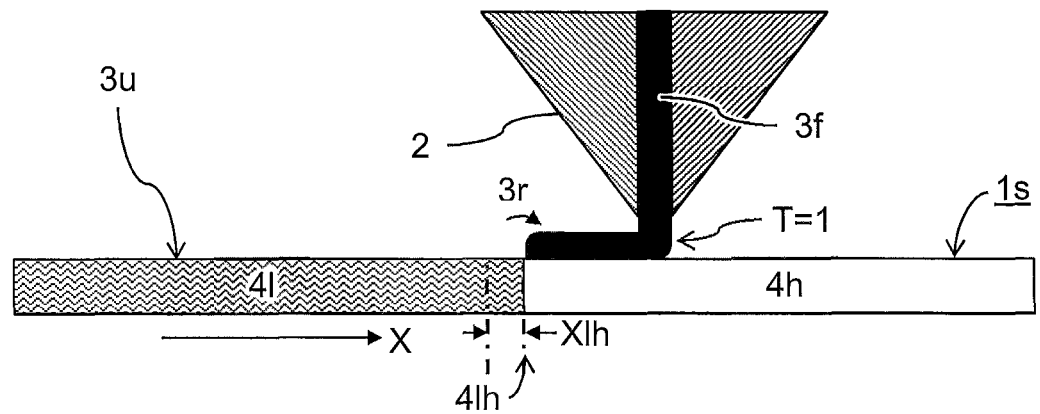

FIGS. 6A-6C illustrate an embodiment wherein a slot-die coating head 2 moves in coating direction X over a boundary 4*lh* from a low surface energy area 4*l* to a high surface energy area 4*h*.

Initially, as shown in FIG. 6A, transfer is disabled (T=0) between the slot-die coating head 2 and the substrate surface 1*s* while the slot-die coating head 2 approaches the boundary 4*lh*. This results in an uncoated area 3*u* on top of the low surface energy area 4*l*. As shown, in this embodiment, the coating fluid 3*f* is receded somewhat into the outflow opening 2*a*, e.g. due to a breakup of the coating fluid as was described in FIGS. 5A-5C.

Then, as shown in FIG. 6B, the transfer is resumed (T=0→1) at the point that the outflow opening 2*a* reaches the offset Xlh before boundary 4*lh*. In this embodiment, transfer is resumed by decreasing a distance Z between the slot-die coating head 2 and the substrate surface 1*s*. Because the coating fluid 3*f* was receded into the outflow opening 2*a*, there may be some variation in the precise point where the coating fluid 3*f* begins to contacts the substrate surface 1*s*. Advantageously, the low surface energy area 4*l* may in part repel the coating fluid 3*f* from sticking to the substrate surface 1*s*. This may cause the coating fluid 3*f* to be dragged by the slot-die coating head 2 until it reached the high surface energy area 4*h*.

Finally, as shown in FIG. 6C, transfer is enabled (T=1) while the slot-die coating head 2 moves over the high surface energy area 4*h*. As shown, the coating fluid that had started to flow already before the boundary 3*fd* may start to stick to substrate surface 1*s* at boundary 4*lh* of the high surface energy area 4*h*. Any coating fluid 3*f* that was deposited on the edge of the low surface energy area 4*l* may still migrate to the high surface energy area 4*h* as indicated by arrow 3*r*. It will be appreciated that the pre-patterned substrate may thus improve placement accuracy of the coated layer to the designated high surface energy area 4*h*.

Figure 7A:
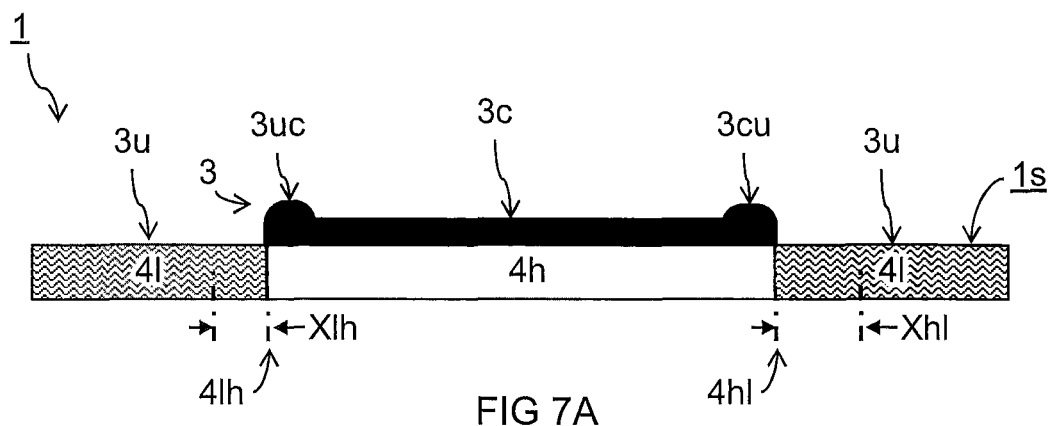
FIGS. 7A-7C illustrates embodiments of a substrate wherein a thickness of the edges varies.
Figure 7B:
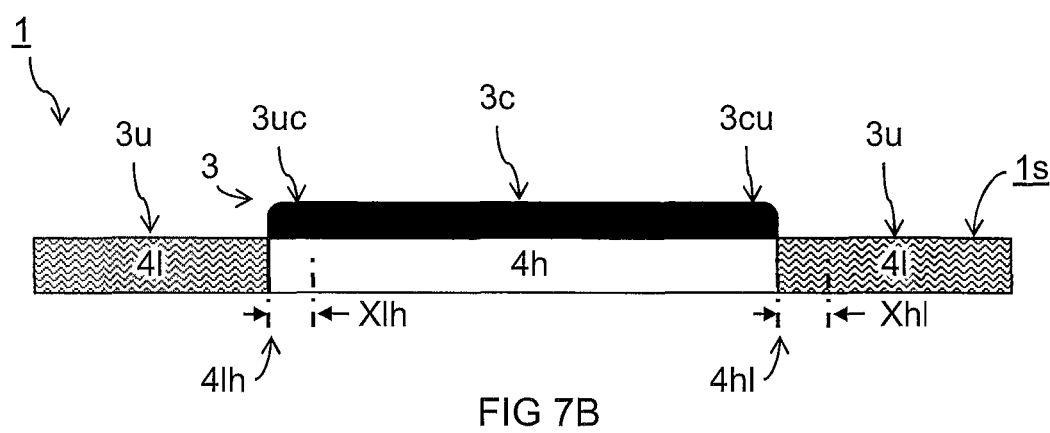
Figure 7C:
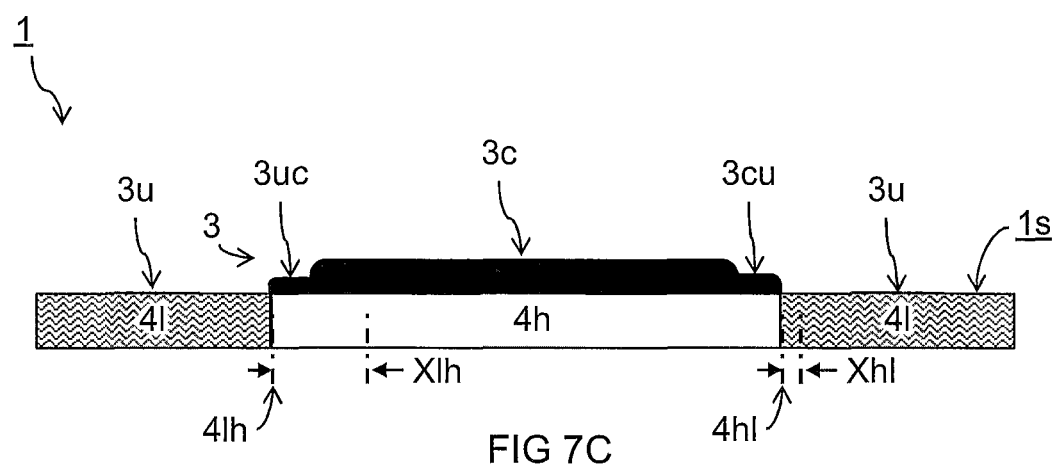

FIGS. 7A-7C illustrates embodiments of a substrate 1 wherein a thickness of the trailing edge 3*cu* and leading edge 3*cu* varies. As discussed in FIGS. 3-6, the edge thickness and resulting homogeneity of the coating layer 3 may be controlled by adjusting the offsets Xlh and Xhl in relation to the other coating parameters.

FIG. 7A shows an embodiment of a substrate 1 wherein the edges 3*uc* and 3*cu* are both thicker than the rest of the coated layer 3. The edge 3*uc* may e.g. result from resuming transfer too early with respect to the boundary 4*lh* in a process such as described in FIGS. 4A-4C or FIGS. 6A-6C. The edge 3*cu* may e.g. result from interrupting transfer too late with respect to the boundary 4*hl* in a process such as described e.g. in FIGS. 3A-3C or FIGS. 5A-5C.

FIG. 7B shows an embodiment of a substrate 1 wherein the edges 3*uc* and 3*cu* have a uniform thickness with the rest of the coated layer 3*c*. Theses may be the desired values for the offsets Xlh and Xhl for a given set of coating. In this case a desired value for the offset Xlh lies after the boundary 4*lh* from a perspective of the coating head (not shown here).

Furthermore a desired value for the offset Xhl lies after the boundary 4*hl* from a perspective of the coating head. This substrate 1 may correspond e.g. to a manufacturing process such as described in FIGS. 3A-3C and FIGS. 4A-4C.

FIG. 7C shows an embodiment of a substrate 1 wherein the edges 3*uc* and 3*cu* are both thinner than the rest of the coated layer 3*c*. The edge 3*uc* may e.g. result from resuming transfer too late with respect to the boundary 4*lh* in a process such as described in FIGS. 4A-4C or FIGS. 6A-6C. The edge 3*cy* may e.g. result from interrupting transfer too early with respect to the boundary 4hl in a process such as described e.g. in FIGS. 3A-3C or FIGS. 5A-5C.

In an embodiment, for a given set of coating parameters the offsets Xlh and Xhl are be varied to interrupt and resume, respectively, the transfer just before and/or just after reaching the respective boundaries 4lh and 4hl between the low surface energy areas 4l and high surface energy areas 4h. Resulting coated areas 3c for the given set of coating parameters and varying offsets are inspected, e.g. by a microscope, and offsets Xlh and Xhl corresponding to a substrate having minimal edge inhomogeneity is be selected. With these settings for the offsets Xlh and Xhl, a batch production of substrates with patterned layers having minimal edge inhomogeneity is produced. It is noted that either one or both of the offsets Xlh and Xhl can be negative or positive, i.e. before or after the boundaries between the low surface energy areas 4l and high surface energy areas 4h. The values for the offsets Xlh and Xhl are not necessarily the same although they may be interrelated due to a reciprocity between excess or lack of fluid material near the outflow opening at interrupting and resuming the transfer.

Accordingly, in an embodiment, the first and/or second offsets Xlh, Xhl are adjusted to minimize layer thickness variation of the coated areas (3c).

Figure 8A:
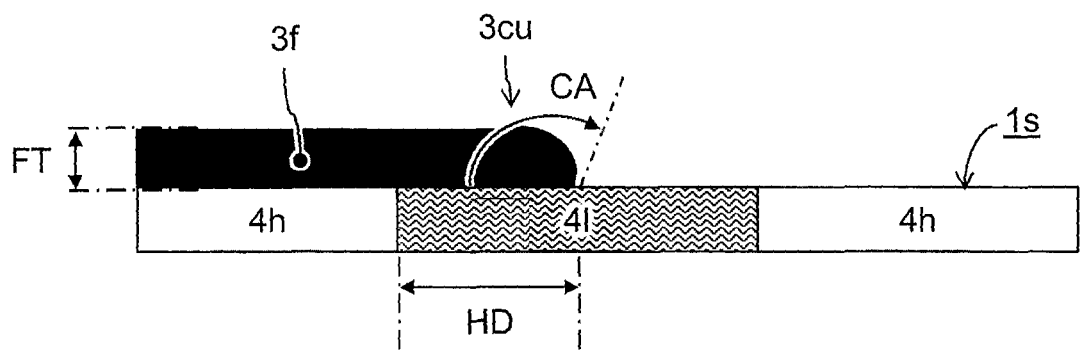
FIGS. 8A-8C describes a model of a coating fluid on a substrate surface.
Figure 8B:
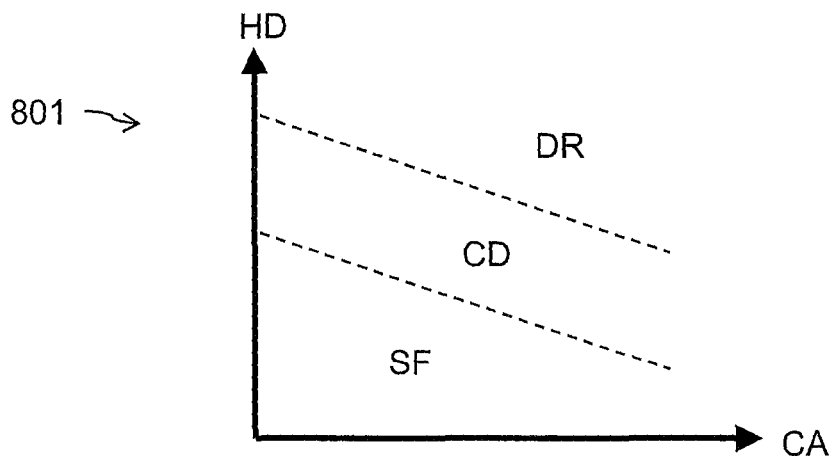
Figure 8C:
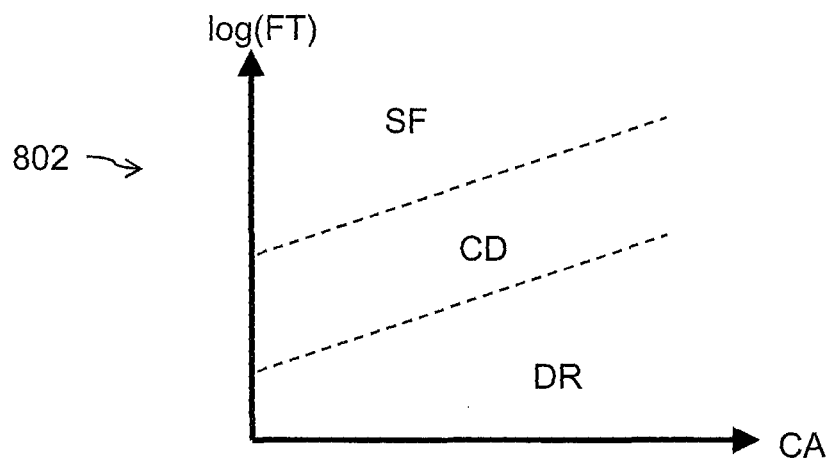

FIGS. 8A-8C describe a model of a coating fluid 3f on a substrate surface 1s comprising high surface energy areas 4h and low surface energy areas 4l.

FIG. 8A shows a fluid layer of coating fluid 3f having a film thickness "FT". A leading edge 3cu of the fluid layer is arranged on the low surface energy area 4l, e.g. a hydrophobic layer. To retract back to the high surface energy area 4h, the fluid layer edge 3cu may traverse a hydrophobic distance "HD". The fluid layer edge 3cu has a contact angle "CA" with the low surface energy area 4l. It is noted that a lower surface energy of the substrate surface 1s typically corresponds to a higher contact angle "CA" of the coating fluid 3f thereon.

In one embodiment, a surface area may be characterized as a "low surface energy area" when a contact angle of the used coating fluid on the said surface area is more than 90 degrees plane angle, preferably more than 110 degrees plane angle. In one embodiment, a surface area may be characterized as a "high surface energy area" when a contact angle of the used coating fluid on the said surface area is less than 50 degrees plane angle, preferably less than 10 degrees plane angle. Alternatively or in addition, the "low surface energy area" and "high surface energy area" may also be defined in terms of a difference in the respective contact angles, e.g. preferably a difference of more than 30 degrees plane angle, more preferably a difference of more than 60 degrees plane angle, most preferably a difference of more than 90 degrees plane angle.

In one aspect, the substrate comprises a pre-patterned layer comprises a pre-patterned layer of high surface energy areas and low surface energy areas. This may be achieved by patterning the substrate surface with a hydrophobic or an oleophobic material to form a mask, to allow patterning of aqueous or non-aqueous liquids, respectively.

Alternatively or in addition, a hydrophilic or oleophilic surface pattern may be created. Manufacturing a pre-patterned layer is described e.g. in US2008/0075837.

The substrate, may be made of any suitable material, e.g. a foil comprising PEN, PET, PEEK, PI, or PEI, or a metal foil, e.g. copper, stainless steel, or aluminium. Also rigid substrates can be used, e.g. glass. Optionally a moisture barrier may be deposited on the foil. The pre-patterned layer may be deposited on the substrate surface, e.g. using self assembled monolayers, hydrophobic coatings, plasma treatments, roughness treatments, flexographic printer roller, gravure coating, offset printing, screen printing, plasma deposition or treatment, photolithography, micro-contact printing, inkjet printing or selective removal of a uniform layer of the material by laser or other etching technique, optically writing with light or a laser, electrostatic spray or by plasma treatment or combinations thereof. For example, a superhydrophobic patterning that uses roughness in combination with hydrophobicity might also be used to improve the retraction of coating fluid. Material used for the pre-patterning may e.g. comprise a chemical species containing one or more hydrophobic, lyophobic moieties and one or more adhesive moieties. Examples may include a fluoropolymer or aqueous based silicone release agents. Further examples may include e.g. self assembled monolayers and surface energy modification by means of plasma treatment, e.g. hydrophobizing plastic films by exposure to a $CF_4$ plasma. In one embodiment, the pre-patterning layer is an integral part of the substrate. Alternatively or in addition a separate patterned layer may be applied. It will be appreciated that the pre-patterned layer may be very thin since the fluid behaviour is principally affected by an exposed surface of the pre-patterned layer.

The coating fluid may be aqueous or non-aqueous, depending on the pre-patterning. The coating composition may be chosen for specific properties, e.g. conductive or photonic properties, depending on a use of the manufactured device, e.g. optoelectronic devices such as light emitting and/or photovoltaic devices. After the coating fluid has been deposited onto the substrate and has retracted from the low surface energy area the fluid may be dried or cured. Once the coated layers deposited in a first pass are dry, additional layers can be deposited e.g. as described below with reference to FIGS. 11A and 11B.

In one embodiment, a substrate surface is patterned as follows. A low surface energy is achieved by deposition of a self assembled monolayer of a fluorinated alkyl trichlorosilane such as Perfluorooctyltrichlorosilane by chemical vapour deposition on a plastic film covered with a moisture barrier finished with a SiN layer. The hydrophobic layer is then partially removed by selective plasma treatment, e.g. by plasma printing or plasma treatment through a mask. Onto this substrate there is applied a coating fluid such as a water based PEDOT:PSS solution or toluene based solution of light emitting polymers. Once applied, the coating fluid may be dried e.g. by an oven at a temperature between 25-250 degrees Celsius. Also other coating fluids can be used, e.g. UV curable coating fluids.

FIG. 8B shows a graph 801 of different regions of behaviour of the coating fluid on the substrate surface as a function of hydrophobic distance "HD" and contact angle "CA". For high values of the hydrophobic distance "HD" and contact angle "CA", a region DR is observed wherein droplets of coating fluid may remain on the low surface energy area, e.g. due to a rapid withdrawal of the coating fluid over a large distance. For low values of the hydrophobic distance "HD" and contact angle "CA", a region "SF" is observed wherein a solid film of coating fluid may remain on the low surface energy area. For intermediate values of the hydrophobic distance "HD" and contact angle "CA", a region "CD" is observed wherein the coating fluid may completely dewet the low surface energy area. In one embodiment, a hydrophobic distance "HD" is adjusted for a given contact angle "CA" to fall within the region of complete dewetting "CD". A hydrophobic distance may e.g. be adjusted by setting the offsets Xlh and Xhl as described in FIGS. 3-6.

FIG. 8C shows a graph 802 of different regions of behaviour of the coating fluid on the substrate surface as a function of a logarithm of the film thickness "log(FT)" and contact angle "CA". For high values of the logarithm of the film thickness "log(FT)"and low values of the contact angle "CA", a region "SF" is observed wherein a solid film of coating fluid may remain on the low surface energy area. For low values of the logarithm of the film thickness "log(FT)"and high values of the contact angle "CA", a region DR is observed wherein droplets of coating fluid may remain on the low surface energy area. For intermediate values of the logarithm of the film thickness "log(FT)" and contact angle "CA", a region "CD" is observed wherein the coating fluid may completely dewet the low surface energy area. In one embodiment, a film thickness "FT" of the coating fluid is adjusted for a given contact angle "CA" to fall within the region of complete dewetting "CD".

Figure 9A:
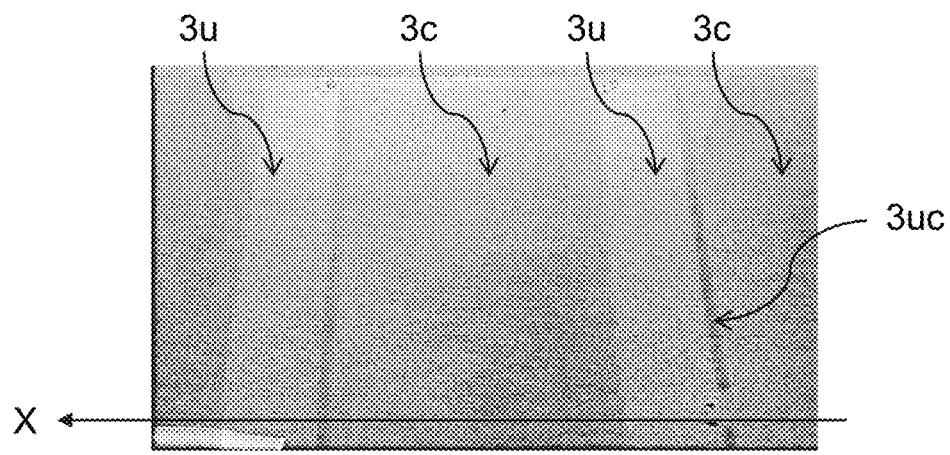
FIGS. 9A-9C show perspective photos of substrates comprising patterned coating layers.
Figure 9B:
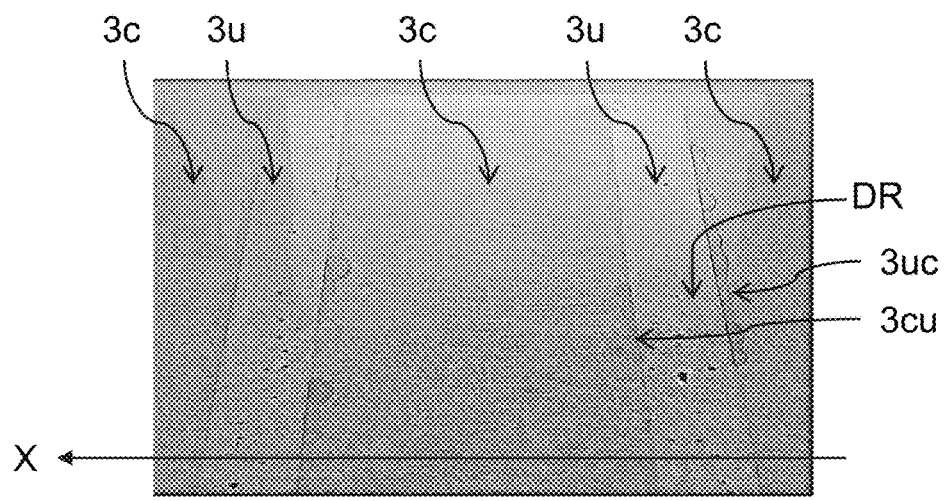
Figure 9:
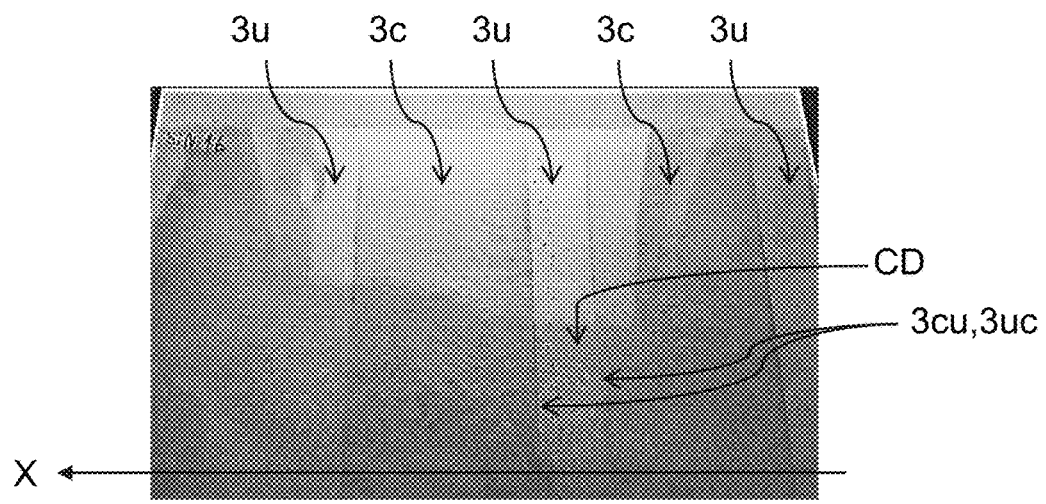

FIGS. 9A-9C show perspective photos of substrates comprising patterned coating layers manufactured using different slot-die coating processes with a coating head (not shown here) moving in coating direction X relative to the substrate. As shown the coating layers comprise coated areas 3c separated by uncoated areas 3u. Darker areas on the photos may be indicative of inhomogeneities of the coating layer and/or droplet formation.

FIG. 9A shows a patterned coating layer produced by using only active patterning, i.e. an intermittent coating transfer process, e.g. periodically removing the coating head from the substrate and/or interrupting the flow of coating fluid. It may be observed from the darker areas at the edges of the coated areas 3c that this process by itself may lead to inhomogeneous edges 3uc of the coated area 3c.

FIG. 9B shows a patterned coating layer produced by using only pre-patterning, i.e. providing areas of high surface energy and areas of low surface energy on the substrate prior to continuously applying the coating fluid. It may be observed from the darker areas at the edges of the coated areas 3c on the substrate that this process by itself may lead to inhomogeneous and irregular edges 3uc and 3cu. As indicated by the reference "DR", it may further be observed by the dark spots in the uncoated areas 3u that droplets of coating fluid remain. This corresponds to the parameter region "DR" as described, in FIGS. 8B and 8C.

FIG. 9C shows a patterned coating layer produced by using a combination of both active patterning and pre-patterning as described herein. It may be observed that this combination of techniques has an improved edge homogeneity compared to either of the techniques separately. As indicated by the reference "CD", it may further be observed by the reduction or absence of dark spots in the uncoated areas 3u that the dewetting of the uncoated areas 3c is improved compared to e.g. FIG. 9B. This corresponds to the parameter region "CD" as described in FIGS. 8B and 8C.

Figure 10:
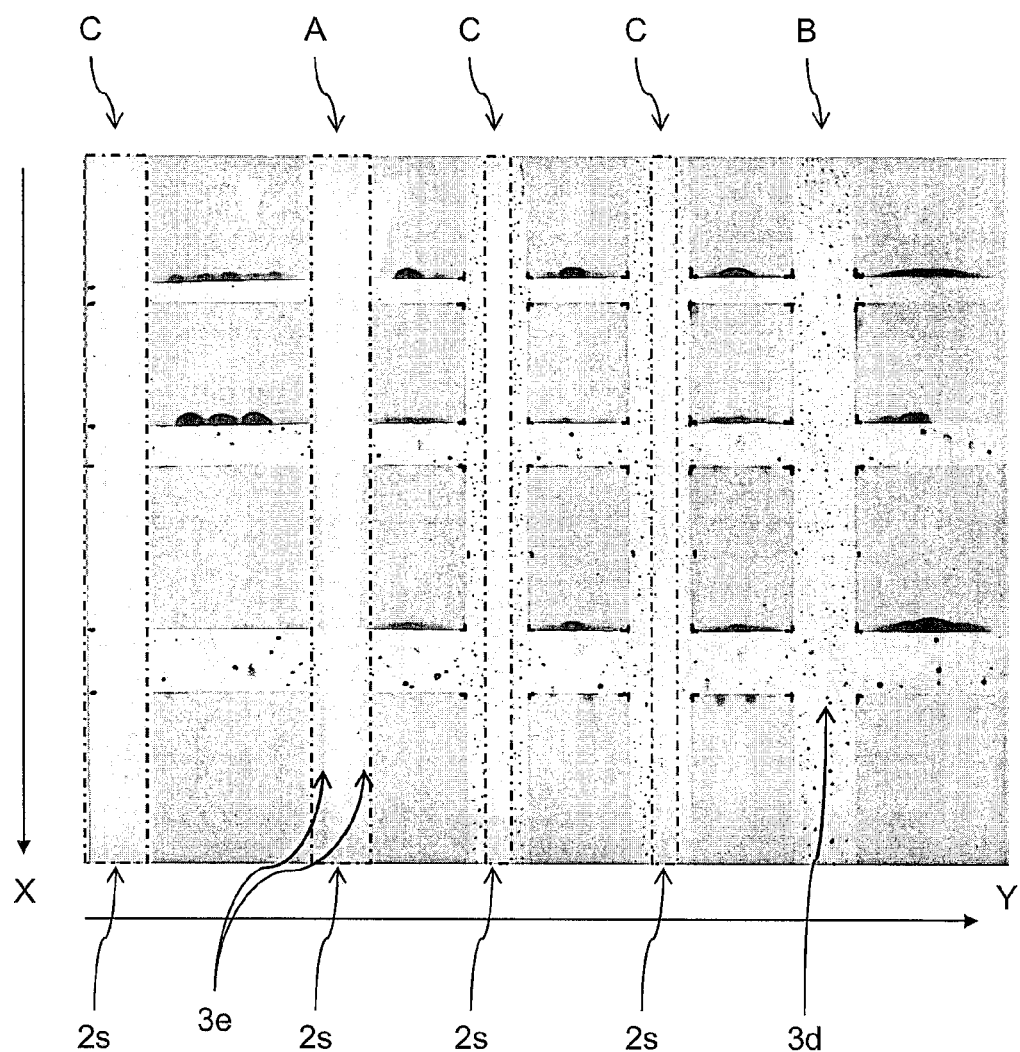
FIG. 10 shows cut-out photos providing top views of three different substrates comprising patterned coating layers.

FIG. 10 shows a top view of a substrate comprising patterned coating layers. The coating layers were manufactured using different combinations of slot-die coating processes with a coating head (not shown here) moving in coating direction X relative to the substrate. Darker areas on the photos may be indicative of inhomogeneities of the coating layer and/or droplet formation.

The passages between the coated layers indicated with references "A" and "C" were manufactured with a slot-die coating head comprising shims in the slit direction Y at the dash-dotted areas indicated by reference numerals 2s. The shims divide the outflow opening of the slot-die coating head into a plurality of slits, e.g. as described in FIG. 2. Areas indicated with references "B" and "C" were pre-patterned with low surface energy areas coinciding with the dash-dotted areas 2s where the shims block the outflow of coating fluid.

The passage indicated with reference "A" is thus manufactured with only shims and no prepatterning; the passage indicated with reference "B" is manufactured with pre-patterning only and no shims; and the passage s indicated with reference "C" are manufactured using a combination of shims and pre-patterning. For all areas, in addition to patterning in the slit direction Y, a transfer of the coating fluid was intermittently interrupted in the coating direction X. This results in coated areas with a two-dimensional rectangular pattern. It may be noted that for a combination of shim coating and pre-patterning less droplets remain on the pathway between the coated areas and also that the edges are better determined. For example, for passage "A", it can be seen that the edges 3e have flowed back after the shims passed. Furthermore, the passages C where the shims passed over the substrate are virtually free from droplets 3d compared e.g. to passage B. It is thus found that a combination of pre-patterning and shim coating may provide advantages over either technique separately.

Figure 11A:
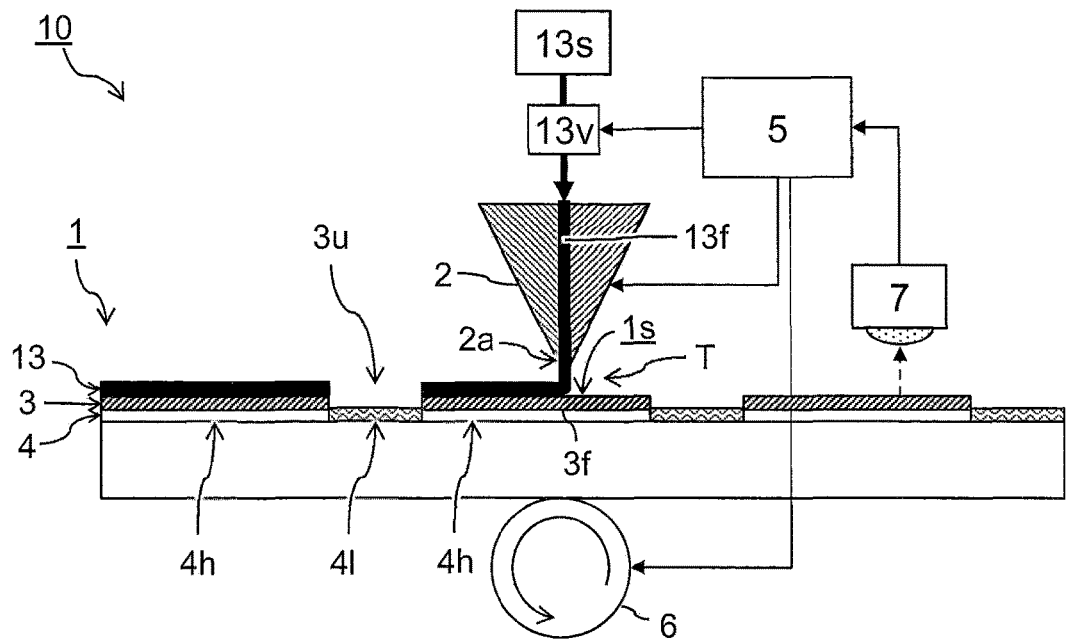
FIGS. 11A and 11B illustrate an embodiment wherein multiple patterned coating layers are provided on a substrate.
Figure 11B:
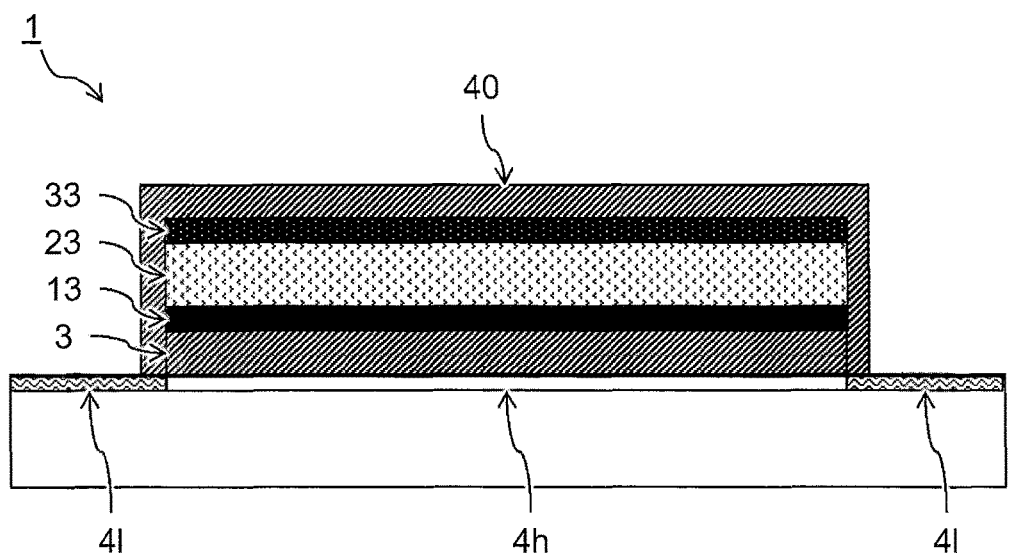

FIGS. 11A and 11B illustrate an embodiment wherein multiple patterned coating layers are provided on a substrate 1. FIG. 11A shows a cross-sectional view of a slot-die coating apparatus 10 for this embodiment. FIG. 11B shows an example of a resulting substrate 1 having multiple layers 3, 13, 23, 33.

As shown, the patterned coating layer forms a first patterned coating layer 3 and a second patterned coating layer 13 is applied onto the first patterned coating layer 13. Advantageously; the coating fluid 13f of the second patterned coating layer 13 has a lower contact angle on the coated areas 3c of the first patterned coating layer 3 than on the uncoated areas 3u of the substrate surface 1s. The coating fluid 13f can be supplied e.g. from a second coating fluid supply 13s via valve 13v which may be connected to the same coating head 2 as the first coating fluid supply and valve or a separate coating head. In this way similar advantages may be achieved as for deposition of the first coating layer. Advantageously, an alignment between the second patterned coating layer 13 and the first patterned coating layer 3 may be improved.

One embodiment comprises repeating manufacturing patterned coating layers, each next coating layer on top of a previously coated layer to produce a patterned multi layer stack. As shown in FIG. 11B, this process may be repeated to produce a plurality of coating layers 3, 13, 23, 33 wherein a coating fluid of each next coating layer has a lower contact angle on the previously coated layer than on the uncoated areas 3u of the substrate surface 1s. Advantageously, the slot-die coating method can thus be used to manufacture a patterned array of multi layer stacks, e.g. forming a solar cell array. In one embodiment, a solar cell or light-emitting device is formed wherein reference numeral 3 indicates a moisture barrier layer, reference numeral 13 indicates an anode layer, reference numeral 23 indicates a photo-active layer or light-emitting layer, which may comprise also multiple layers, and reference numeral 33 indicates a cathode layer. In one embodiment, as shown, a further sealing layer 40, e.g. a moisture barrier, may be applied to cover the patterned multi layer stack 3, 13, 23, 33 and optionally also extend to cover the low surface energy areas 4l. The sealing layer may function e.g. to prevent deterioration of water-sensitive organic layers e.g. organic light-emitting or photovoltaic layers.

Figure 12:
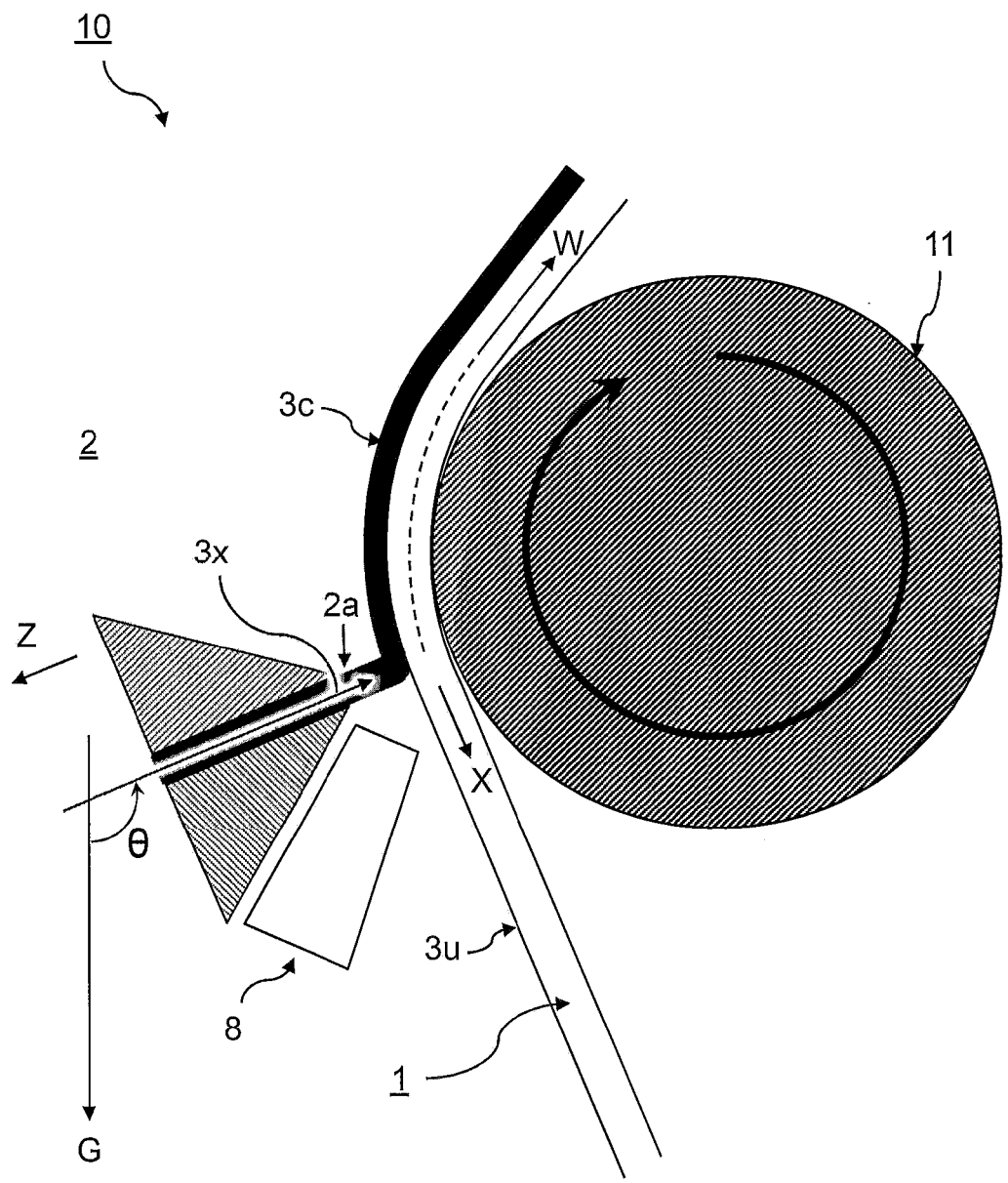
FIG. 12 shows another embodiment of the slot die coating method and apparatus.

FIG. 12 shows another embodiment of the slot die coating method and apparatus 10. The apparatus 10 comprises a transporter for transporting a substrate 1. In the shown embodiment, the transporter comprises a roll or drum 11 for handling a flexible substrate 1 partly wrapped around the drum 11. The drum 11 rotates to move the substrate 1 in a web direction W. This is equivalent to a relative motion of the slot-die coating head 2 with respect to the substrate 1 in coating direction X.

In one embodiment, the slot-die coating head 2 is tilted at an angle to provide an outflow from the outflow opening 2a in an outflow direction 3x having an angle θ between 60 and 120 degrees plane angle with respect to a gravitational direction G. In other words, the coating fluid can flow close to a horizontal direction. The substrate 1 is moved substantially perpendicular to the outflow direction 3x, in front of the outflow opening 2a. Having a coating fluid flow close to a horizontal direction and neither the coating head nor the substrate beneath the outflow opening as seen in a gravitational direction, can have an advantage that if any uncontrolled excess coating ink/fluid falls from the coating head or the outflow opening, such excess coating ink/fluid will fall downwards, i.e. not on the substrate or the coating head. It will be appreciated that such an arrangement can be particularly advantageous in the present methods and systems wherein a coating supply is regularly interrupted.

Optionally a suction device 8 can be provided to suck up the excess coating ink/fluid. Alternatively or in addition, a suction device or vacuum chamber 8 having an opening near the outflow opening 2a can have a function to pull a meniscus of the outflow backwards compared to the web direction W of the moving substrate 1. This may compensate a fast moving substrate pulling the meniscus of the outflow in the web direction W. Providing a suction on an opposite side of the outflow opening 2a with respect to a movement of a substrate can thus allow faster relative movements, e.g. preventing air bubbles from getting trapped under the coating layer.

In another or further embodiment, the slot-die coating head 2 is tilted at an angle to provide an outflow from the outflow opening 2a in an outflow direction 3x having an angle θ of more than 90 degrees plane angle with respect to a gravitational direction G. In other words, the outflow direction 3x is tilted upwards. Having an upward outflow direction 3x can have an advantage that air bubbles trapped in the fluid supply and being lighter than the coating fluid, can escape from the outflow opening by moving upwards. It will be appreciated that this can be particularly useful when the fluid supply is intermittently interrupted according to the present methods and systems.

While example embodiments were shown for providing a coating layer on a substrate, also alternative ways may be envisaged by those skilled in the art having the benefit of the present disclosure for achieving a similar function and result. The various elements of the embodiments as discussed and shown offer certain advantages, such as providing homogeneous coating layers. Of course, it is to be appreciated that any one of the above embodiments or processes may be combined with one or more other embodiments or processes to provide even further improvements in finding and matching designs and advantages, e.g. combinations of slot die coating, intermittent coating, shim coating, and/or pre-patterning a substrate. It is appreciated that this disclosure offers particular advantages to the manufacture of solar cell arrays, and in general can be applied for any application of large-scale production of homogeneous patterned layers on a substrate or web.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

The invention claimed is:

1. A slot-die coating method for manufacturing a patterned coating layer on a substrate, the method comprising:
   providing a slot-die coating head comprising an outflow opening from which outflow opening, in use, flows a coating fluid, wherein the outflow opening forms a slit that is, in use, arranged in a slit direction over the substrate surface;
   controlling a relative movement between the outflow opening and the substrate surface along a coating direction transverse to the slit direction;
   controlling an intermittent transfer of the coating fluid from the slot-die coating head onto the substrate surface to provide, by said intermittent transfer, coated areas on the substrate surface separated by uncoated areas; wherein
   the substrate surface comprises a pre-patterned layer of high surface energy areas and low surface energy areas; wherein a contact angle of the coating fluid on the substrate surface is lower in the high surface energy areas than in the low surface energy areas; wherein boundaries between the low surface energy areas and high surface energy areas are arranged along the slit direction; and wherein the method further comprises:
   synchronizing the intermittent transfer with a passage of the outflow opening over the boundaries between the low surface energy areas and high surface energy areas wherein the transfer is enabled when the outflow opening passes over a high surface energy area and wherein the transfer is disabled when the outflow opening passes over a low surface energy area.

2. The method according to claim 1, wherein the synchronizing the intermittent transfer comprises:
   setting a first offset between a position of the outflow opening over the substrate surface along the coating direction where the transfer is interrupted and a boundary from a high surface energy area to a low surface energy area; and/or setting a second offset between a position of the outflow opening over the substrate surface along the coating direction where the transfer is resumed and a boundary from a low surface energy area to a high surface energy area.

3. The method according to claim 2, wherein the first and/or second offsets are adjusted to minimize layer thickness variation of the coated areas.

4. The method according to claim 1, wherein the transfer is set to be resumed just before or after the outflow opening passes a boundary from a low surface energy area to a high surface energy area .

5. The method according to claim 1, wherein the transfer is set to be interrupted just before or after the outflow opening passes a boundary from a high surface energy area to a low surface energy area.

6. The method according to claim 1, wherein the intermittent transfer of the coating fluid from the slot-die coating head onto the substrate surface is controlled by
increasing a distance between the outflow opening and the substrate surface to interrupt the transfer; and
decreasing a distance between the outflow opening and the substrate surface to resume the transfer.

7. The method according to claim 1, wherein the slot-die coating head is tilted at an angle to provide an outflow from the outflow opening in an outflow direction having an angle of more than 90 degrees plane angle with respect to a gravitational direction.

8. The method according to claim 1, wherein
the pre-patterned layer comprises low surface energy areas having parallel boundaries with high surface energy areas along the coating direction;
one or more shims are arranged in the outflow opening dividing the outflow opening into a plurality of slits; wherein
the one or more shims are aligned with the parallel boundaries to block a transfer of the coating fluid from the slot-die coating head onto the substrate surface at the said low surface energy areas having parallel boundaries with high surface energy areas along the coating direction.

9. The method according to claim 1, wherein the patterned coating layer forms a first patterned coating layer and a second patterned coating layer is applied onto the first patterned coating layer; wherein coating fluid of the second patterned coating layer has a lower contact angle on the coated areas of the first patterned coating layer than on the uncoated areas of the substrate surface.

10. The method for producing a solar cell array comprising using the slot-die coating method according to claim 8 and repeating manufacturing patterned coating layers, each next coating layer on top of a previously coated layer to produce a patterned multi-layer stack forming the solar cell array, wherein a coating fluid of each next coating layer has a lower contact angle on the previously coated layer than on the uncoated areas of the substrate surface.

11. A slot-die coating apparatus for manufacturing a patterned coating layer on a substrate, the apparatus comprising:
a substrate carrier arranged for providing the substrate comprising a substrate surface;
a slot-die coating head comprising an outflow opening from which outflow opening, in use, flows a coating fluid, wherein the outflow opening forms a slit that is, in use, arranged in a slit direction over the substrate surface; and
a controller arranged for controlling a relative movement between the outflow opening and the substrate surface along a coating direction transverse to the slit direction;
wherein the controller is further arranged for controlling an intermittent transfer of the coating fluid from the slot-die coating head onto the substrate surface to provide, by said intermittent transfer, coated areas on the substrate surface separated by uncoated areas; wherein
in use, the substrate surface comprises a pre-patterned layer of high surface energy areas and low surface energy areas; wherein a contact angle of the coating fluid on the substrate surface is lower in the high surface energy areas than in the low surface energy areas; wherein boundaries between the low surface energy areas and high surface energy areas are arranged along the slit direction; and wherein the apparatus further comprises:
a synchronizer comprising a sensor for determining positions of the high and low surface areas of the pre-patterned coating layer relative to the slot-die coating head, wherein the synchronizer is operatively linked to the controller for synchronizing the intermittent transfer with a passage of the outflow opening over the boundaries between the low surface energy areas and high surface energy areas wherein the transfer is enabled when the outflow opening passes over a high surface energy area and wherein the transfer is disabled when the outflow opening passes over a low surface energy area.

12. The apparatus according to claim 11, wherein the synchronizing the intermittent transfer comprises:
setting a first offset between a position of the outflow opening over the substrate surface along the coating direction where the transfer is interrupted and a boundary from a high surface energy area to a low surface energy area; and/or
setting a second offset between a position of the outflow opening over the substrate surface along the coating direction where the transfer is resumed and a boundary from a low surface energy area to a high surface energy area.

13. The apparatus according to claim 11, wherein the apparatus comprises a motor and the controller is arranged for controlling the motor for:
increasing a distance between the outflow opening and the substrate surface to interrupt the transfer ; and
decreasing a distance between the outflow opening and the substrate surface to resume the transfer.

14. The apparatus according to claim 11, wherein:
one or more shims are arranged in the outflow opening dividing the outflow opening into a plurality of slits; wherein, in use,
the one or more shims are aligned with the parallel boundaries to block a transfer of the coating fluid from the slot-die coating head onto the substrate surface at the said low surface energy areas with parallel boundaries along the coating direction.

* * * * *